US012789306B2

(12) United States Patent
Terada et al.

(10) Patent No.: US 12,789,306 B2
(45) Date of Patent: Nov. 10, 2026

(54) MOUNTING METHOD AND CUTTING APPARATUS

(71) Applicant: DISCO CORPORATION, Tokyo (JP)

(72) Inventors: Kazuki Terada, Tokyo (JP); Kenichi Fujie, Tokyo (JP); Zhibo Su, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 482 days.

(21) Appl. No.: 18/453,451

(22) Filed: Aug. 22, 2023

(65) Prior Publication Data

US 2024/0082968 A1 Mar. 14, 2024

(30) Foreign Application Priority Data

Sep. 9, 2022 (JP) ................................ 2022-144119

(51) Int. Cl.
*B23Q 3/155* (2006.01)
*B23Q 3/16* (2006.01)
(Continued)

(52) U.S. Cl.
CPC ...... *B23Q 3/15503* (2016.11); *B23Q 3/15526* (2013.01); *B23Q 3/16* (2013.01);
(Continued)

(58) Field of Classification Search
CPC ............ B23Q 3/15513; B23Q 3/15526; B23Q 3/1554; B23Q 3/16; B23Q 3/15503;
(Continued)

(56) References Cited

U.S. PATENT DOCUMENTS

| | | | | |
|---|---|---|---|---|
| 2019/0283195 | A1* | 9/2019 | Terada | B23Q 3/155 |
| 2019/0358757 | A1* | 11/2019 | Terada | B28D 5/029 |

(Continued)

FOREIGN PATENT DOCUMENTS

| | | | |
|---|---|---|---|
| DE | 10 2021 203 471 A1 | 10/2021 | |
| DE | 10 2022 200 682 A1 | 7/2022 | |
| JP | 2019204929 A | 11/2019 | |

OTHER PUBLICATIONS

Office Action issued by the German Patent Office in counterpart DE Patent Application No. 10 2023 208 429.5, dated Sep. 25, 2025.

*Primary Examiner* — Jermie E Cozart
(74) *Attorney, Agent, or Firm* — GREER BURNS & CRAIN, LTD.

(57) ABSTRACT

A cutting apparatus including a holding table for holding a workpiece; a cutting unit having a cutting blade; a replacing mechanism for replacing consumable products including the cutting blade; a controller for controlling the cutting unit and the replacing mechanism; and a reading unit for reading identification marks on consumable products stored in respective storage regions of a storage tray. The controller includes a storage section for storing information of the consumable products to be mounted in the cutting apparatus, and a replacement product position storage section for identifying and storing which storage regions of the storage tray the consumable products to be mounted in the cutting apparatus have been stored in, on a basis of the identification marks read by the reading unit. Additionally, the replacing mechanism mounts the consumable products from the storage regions identified and stored by the replacement product position storage section in the cutting apparatus.

5 Claims, 14 Drawing Sheets

(51) Int. Cl.

| | |
|---|---|
| *B28D 5/00* | (2006.01) |
| *B28D 5/02* | (2006.01) |
| *H10P 72/00* | (2026.01) |

(52) U.S. Cl.
CPC ........ *B23Q 3/15513* (2013.01); *B23Q 3/1554* (2013.01); *B28D 5/0064* (2013.01); *B28D 5/023* (2013.01); *H10P 72/0428* (2026.01); *Y10T 29/49778* (2015.01); *Y10T 29/4978* (2015.01)

(58) Field of Classification Search
CPC . B28D 5/023; B28D 5/0064; Y10T 29/49778; Y10T 29/4978; H10P 72/0428
See application file for complete search history.

(56) References Cited

U.S. PATENT DOCUMENTS

| | | | | |
|---|---|---|---|---|
| 2020/0238559 | A1* | 7/2020 | Terada ................. | B26D 7/2621 |
| 2021/0316468 | A1 | 10/2021 | Terada et al. | |
| 2021/0316477 | A1* | 10/2021 | Su ....................... | B23B 31/4073 |
| 2022/0040878 | A1* | 2/2022 | Terada ................. | B23Q 3/1554 |
| 2022/0203487 | A1* | 6/2022 | Terada ................... | B23Q 3/157 |
| 2022/0234156 | A1 | 7/2022 | Su et al. | |
| 2022/0258294 | A1* | 8/2022 | Izumi ................... | B23Q 3/1552 |

* cited by examiner

MOUNTING METHOD AND CUTTING APPARATUS

BACKGROUND OF THE INVENTION

Field of the Invention

The present invention relates to a method of mounting a consumable product and a cutting apparatus including consumable products.

Description of the Related Art

A cutting apparatus having cutting blades are widely used as a processing apparatus for cutting semiconductor wafers. Cutting blades are consumable products that are consumed or worn by cutting semiconductor wafers. When a cutting blade is consumed, it needs to be replaced with a brand-new cutting blade.

In order to prevent a brand-new cutting blade from being broken when an operator replaces the existing cutting blade, there has been proposed a cutting apparatus incorporating a blade changer for automatically replacing cutting blades (see, for example, JP 2019-204929A). According to JP 2019-204929A, a storage tray that stores a plurality of consumable products including cutting blades is proposed for use in the cutting apparatus with the blade changer.

SUMMARY OF THE INVENTION

The cutting apparatus with the blade changer disclosed in JP 2019-204929A registers in advance the information of each of the consumable products stored in respective storage regions of the storage tray. The blade changer fetches a consumable product to be mounted on a processing unit from the storage tray on the basis of the registered information. However, it has been tedious and time-consuming to perform pre-processing tasks such as the process of registering the information of each of the consumable products. Therefore, the pre-processing tasks have remained to be improved.

It is therefore an object of the present invention to provide a mounting method and a cutting apparatus that are capable of making pre-processing tasks less tedious and time-consuming.

In accordance with an aspect of the present invention, there is provided a mounting method of mounting consumable products having respective identification marks in a cutting apparatus that includes a holding table for holding a workpiece thereon, a cutting unit having a spindle on which a cutting blade for cutting the workpiece held on the holding table is mounted, and a replacing mechanism for replacing consumable products including the cutting blade. The mounting method includes a storing step of storing a plurality of consumable products on a storage tray having a plurality of storage regions for storing the consumable products therein, a replacement product position identifying step of reading the identification marks on the consumable products stored on the storage tray with a reading unit and identifying which storage regions the consumable products to be mounted in the cutting apparatus are stored in, on the basis of the read identification marks, a positioning step of positioning the storage tray on which the consumable products are stored in a consumable product replacing position, and after the positioning step has been carried out, a mounting step of mounting one of the consumable products from the storage tray in the cutting apparatus with the replacing mechanism on the basis of the storage regions identified in the replacement product position identifying step.

Preferably, the storing step includes storing the consumable products on the storage tray such that no consumable product has been stored in at least one of the storage regions, the mounting method further including after the positioning step has been carried out and before the mounting step is carried out, a dismounting step of dismounting a used consumable product from the cutting apparatus with the replacing mechanism and storing the dismounted used consumable product in the storage region in which no consumable product has been stored.

In accordance with another aspect of the present invention, there is provided a cutting apparatus including a holding table for holding a workpiece thereon, a cutting unit having a spindle on which a cutting blade for cutting the workpiece held on the holding table is mounted, a replacing mechanism for replacing consumable products including the cutting blade, a controller for controlling at least the cutting unit and the replacing mechanism, and a reading unit for reading identification marks on consumable products stored in respective storage regions of a storage tray. The controller includes a storage section for storing information of the consumable products to be mounted in the cutting apparatus, and a replacement product position storage section for identifying and storing which storage regions of the storage tray the consumable products to be mounted in the cutting apparatus have been stored, in on the basis of the identification marks read by the reading unit, and the replacing mechanism mounts the consumable products from the storage regions identified and stored by the replacement product position storage section in the cutting apparatus.

Preferably, the cutting apparatus further includes a cassette rest base on which a cassette storing the workpieces therein is placed, the cassette rest base being liftable and lowerable, and a storage chamber for storing therein the storage tray with the consumable products stored in the storage regions thereof, the storage chamber being lifted and lowered in unison with the cassette rest base, the cassette being placed on the storage chamber, in which the reading unit is disposed in the storage chamber.

Preferably, the consumable products are stored on the storage tray with the identification marks held abutting against the storage tray, the storage tray includes regions aligned with the respective identification marks on the consumable products stored on the storage tray, the regions being each made of a transparent material, and the reading unit includes an image capturing camera for capturing images of the identification marks through the storage tray.

The present invention is advantageous effect in that it can make pre-processing tasks less tedious and time-consuming.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
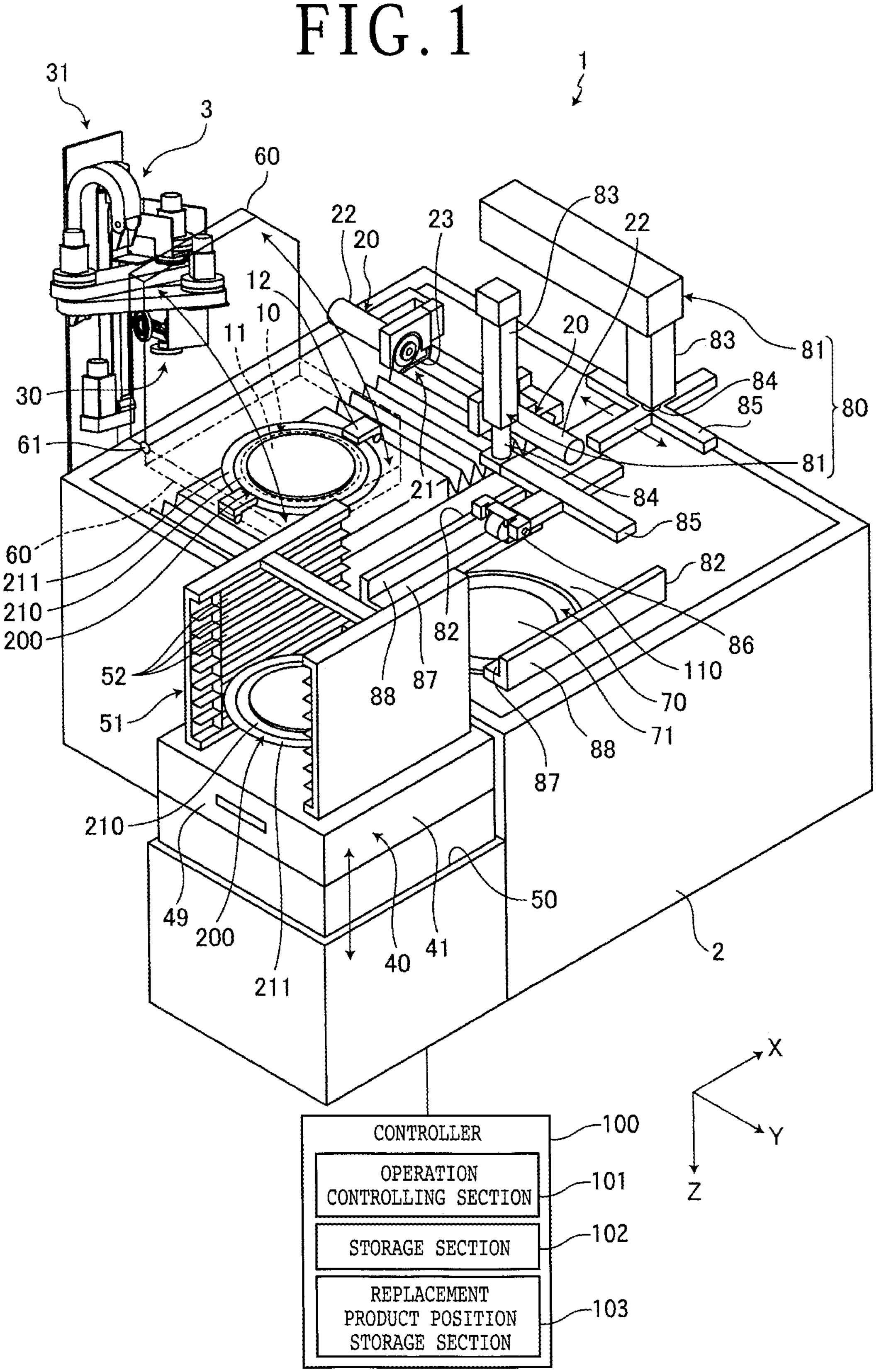
FIG. 1 is a perspective view illustrating a structural example of a cutting apparatus according to an embodiment of the present invention.

A preferred embodiment of the present invention will be described in detail below with reference to the accompanying drawings. The present invention is not limited to the details of the embodiment described below. The components described below cover those which could easily be anticipated by those skilled in the art and those which are essentially identical to those described below. Furthermore, the arrangements described below can be combined in appropriate manners. Various omissions, replacements, or changes of the arrangements may be made without departing from the scope of the present invention. In the description below, those components that are identical to each other are denoted by identical reference characters.

Figure 2:
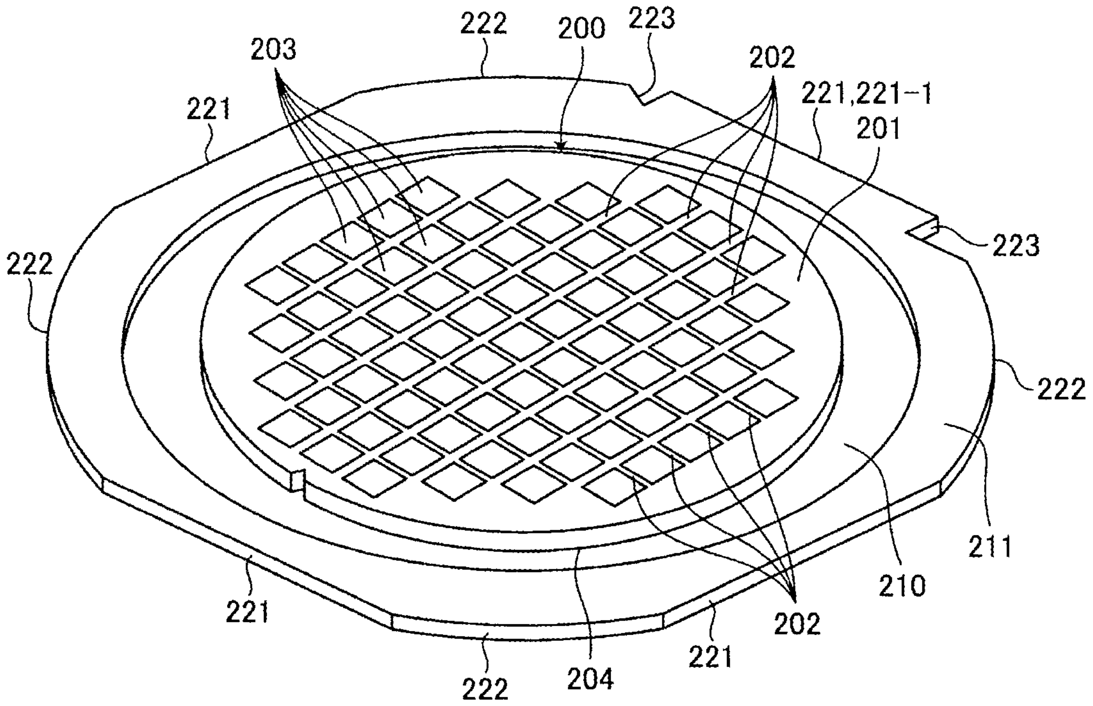
FIG. 2 is a perspective view of a workpiece to be processed by the cutting apparatus illustrated in FIG. 1.

A cutting apparatus according to the present embodiment will be described below with reference to the drawings. FIG. 1 illustrates, in perspective, a structural example of the cutting apparatus according to the present embodiment. FIG. 2 illustrates, in perspective, a workpiece to be processed by the cutting apparatus illustrated in FIG. 1. The cutting apparatus, denoted by 1, is illustrated in reference to a three-dimensional XYZ coordinate system having a horizontal X-axis, a horizontal Y-axis perpendicular to the X-axis, and a vertical Z-axis perpendicular to the X-axis and the Y-axis. The X-axis is indicated by the arrow X, the Y-axis by the arrow Y, and the Z-axis by the arrow Z.

The cutting apparatus 1 is an apparatus for cutting, i.e., processing, the workpiece, denoted by 200, illustrated in FIG. 2. According to the present embodiment, the workpiece 200 includes a semiconductor wafer shaped as a circular plate made of a base material of silicon, sapphire, gallium, or the like, a wafer such as an optical device wafer. As illustrated in FIG. 2, the workpiece 200 has a plurality of devices 203 constructed in respective areas demarcated on a face side 201 thereof by a grid of projected dicing lines 202 established on the face side 201.

According to the present invention, the workpiece 200 may be a generally-called TAIKO (registered trademark) wafer having a thinner central portion and a thicker outer circumferential portion, or a rectangular packaged substrate having a plurality of devices encapsulated by a resin, a ceramic substrate, a ferrite substrate, a glass substrate, a substrate containing at least one of nickel and iron, or the like. According to the present embodiment, the workpiece 200 has a reverse side 204 affixed to an adhesive tape 210 having an outer circumferential edge portion attached to an annular frame 211, and hence is supported on the annular frame 211 by the adhesive tape 210.

The annular frame 211 has an outer edge including two pairs of diametrically opposite straight edge portions 221 extending parallel to each other and two pairs of diametrically opposite arcuate edge portions 222 each disposed between adjacent two of the straight edge portions 221. According to the present embodiment, one of the straight edge portions 221 (hereinafter denoted by 221-1) has two notches 223 defined respectively at its opposite ends. The notches 223 extend from the outer edge of the annular frame 211 radially inwardly toward an inner edge of the annular frame 211.

As illustrated in FIG. 1, the cutting apparatus 1 according to the present embodiment includes a holding table 10 for holding the workpiece 200, on a holding surface 11, under suction, a pair of cutting units 20 each for cutting the workpiece 200 held on the holding table 10 with a cutting blade 21 mounted as a consumable product on a spindle 23, an image capturing unit, not illustrated, for capturing an image of the workpiece 200 held on the holding table 10, a replacing mechanism 3 for replacing the cutting blades 21 of the cutting units 20, and a controller 100 for controlling the components of the cutting apparatus 1. The cutting apparatus 1 cuts, i.e., processes, the workpiece 200 held on the holding table 10 along the projected dicing lines 202 with the cutting blades 21.

The cutting apparatus 1 also has actuating mechanisms including at least an X-axis moving unit, not illustrated, that processing-feeds the holding table 10 along X-axis, a Y-axis moving unit, not illustrated, that indexing-feeds the cutting units 20 along the Y-axis, a Z-axis moving unit, not illustrated, that incising-feeds the cutting units 20 along the Z-axis, and a rotating unit, not illustrated, for rotating the holding table 10 about a vertical central axis along the Z-axis. As illustrated in FIG. 1, the cutting apparatus 1 includes a two-spindle dicer, i.e., a generally-called dual-facing cutting apparatus, having the two cutting units 20.

Figure 3:
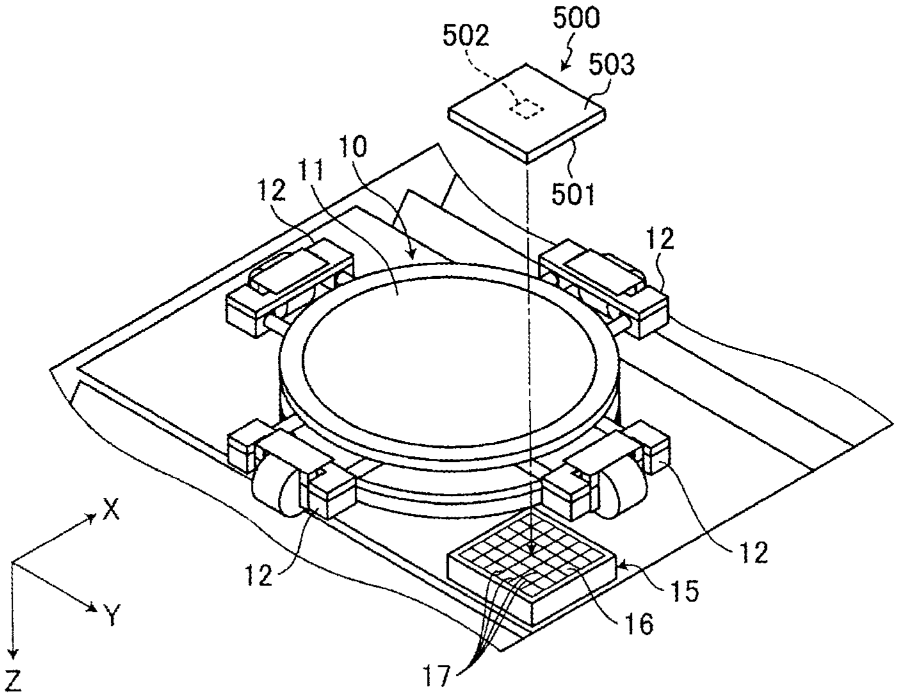
FIG. 3 is a perspective view of a holding table of the cutting apparatus illustrated in FIG. 1.

The holding table 10 will be described below. FIG. 3 illustrates, in perspective, the holding table 10 of the cutting apparatus 1 illustrated in FIG. 1. As illustrated in FIG. 3, the holding table 10 is of a disk shape having an upwardly facing holding surface 11 made of porous ceramic or the like for holding the workpiece 200 thereon. The holding table 10 is movable along the X-axis by the X-axis moving unit between a processing position below the cutting units 20 and a loading and unloading position spaced from the processing position, where the workpiece 200 can be loaded onto and unloaded from the holding table 10. As described above, the holding table 10 is rotatable about its vertical central axis by the rotating unit.

The holding table 10 is fluidly connected to a vacuum suction source, not illustrated. When the vacuum suction source is actuated, it generates and transmits a suction force to the holding surface 11 to attract and hold the workpiece 200 under suction thereon. According to the present embodiment, the holding table 10 attracts and holds the reverse side 204 of the workpiece 200 with the adhesive tape 210 interposed therebetween. As illustrated in FIGS. 1 and 3, a plurality of clamps 12 are disposed around and attached to the holding table 10 for clamping annular frame 211 that supports the workpiece 200 through the adhesive tape 210. In FIG. 1, the devices 203 on the face side 201 of the workpiece 200 and some of the clamps 12 are omitted from illustration.

As illustrated in FIG. 3, the cutting apparatus 1 also includes a sub-chuck table 15 that is movable together with the holding table 10 along the X-axis by the X-axis moving unit. The sub-chuck table 15 is disposed next to the holding table 10. The sub-chuck table 15 holds a dressing board 500 as a consumable product thereon.

The sub-chuck table 15 is shaped as a rectangular plate having an upper surface 16 lying flush with the holding surface 11 of the holding table 10. The dressing board 500 is placed on the upper surface 16 of the sub-chuck table 15. The sub-chuck table 15 has a plurality of suction slots 17 defined in the upper surface 16 that are fluidly connected to a vacuum suction source, not illustrated. When the vacuum suction source is actuated, it generates and transmits a suction force to the suction slots 17, attracting and holding the dressing board 500 under suction on the upper surface 16.

The dressing board 500 sharpens a cutting blade 21 whose cutting capability has been lowered by loading and dulling, thereby restoring the cutting capability. The process of sharpening a cutting blade 21 to restore its cutting capability is referred to as dressing.

The dressing board 500 is shaped as a rectangular plate that is essentially identical in planar shape to the upper surface 16 of the sub-chuck table 15. The dressing board 500 is made of a mixture of a binder of resin or ceramic and abrasive grains of white alundum (WA) that is an alumina-based material, green carbonite (GC) that is a silicon-carbide-based material, or the like.

The dressing board 500 has a lower surface 501 to be placed on the upper surface 16 of the sub-chuck table 15. The dressing board 500 has an identification mark 502 applied to the lower surface 501. The identification mark 502 contains information indicating at least the kind of the dressing board 500. According to the present embodiment, the identification mark 502 represents a well-known two-dimensional code though it may be a one-dimensional code. The identification mark 502 may be in the form of a graphic figure, numerals, characters, or a combination thereof.

Figure 4:
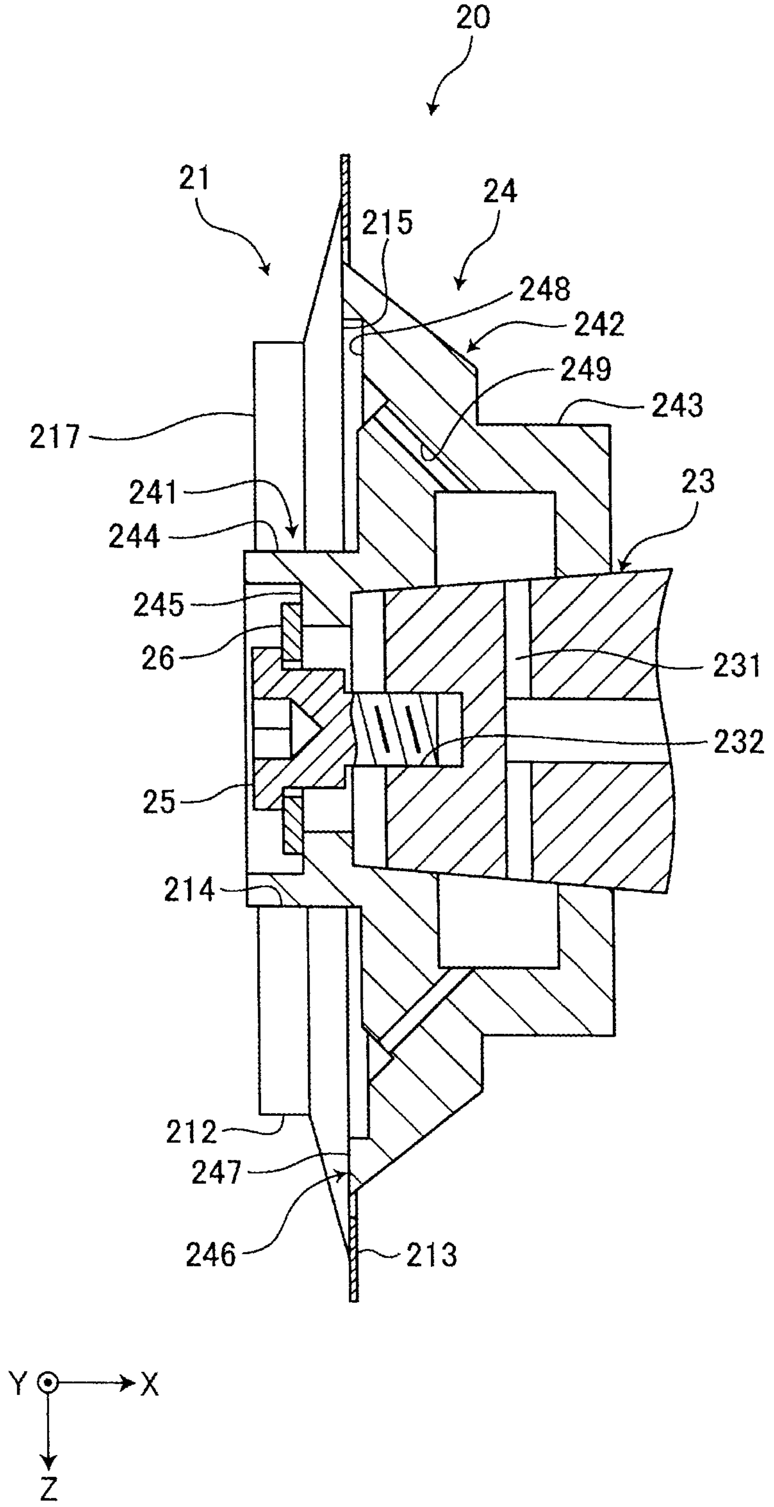
FIG. 4 is a cross-sectional view of a cutting unit of the cutting apparatus illustrated in FIG. 1.
Figure 5:
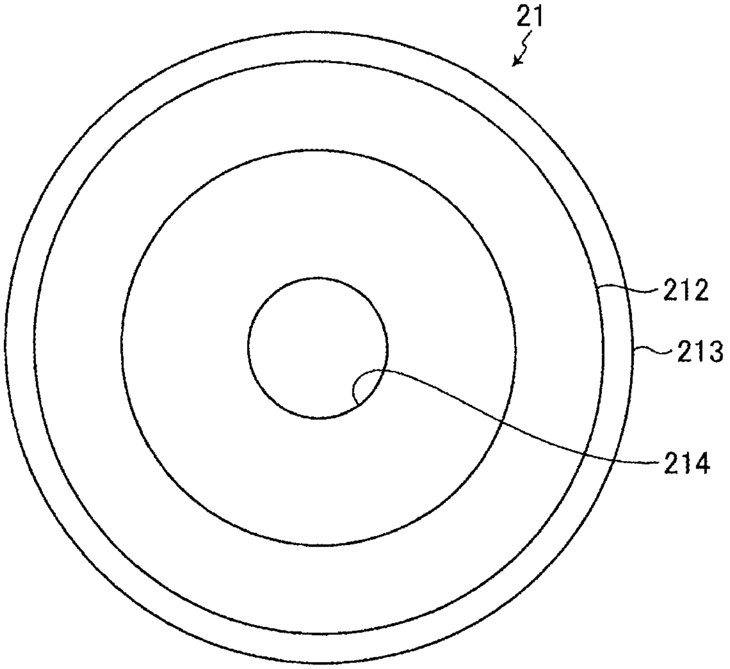
FIG. 5 is a front elevational view of a cutting blade mounted on the cutting unit illustrated in FIG. 4.
Figure 6:
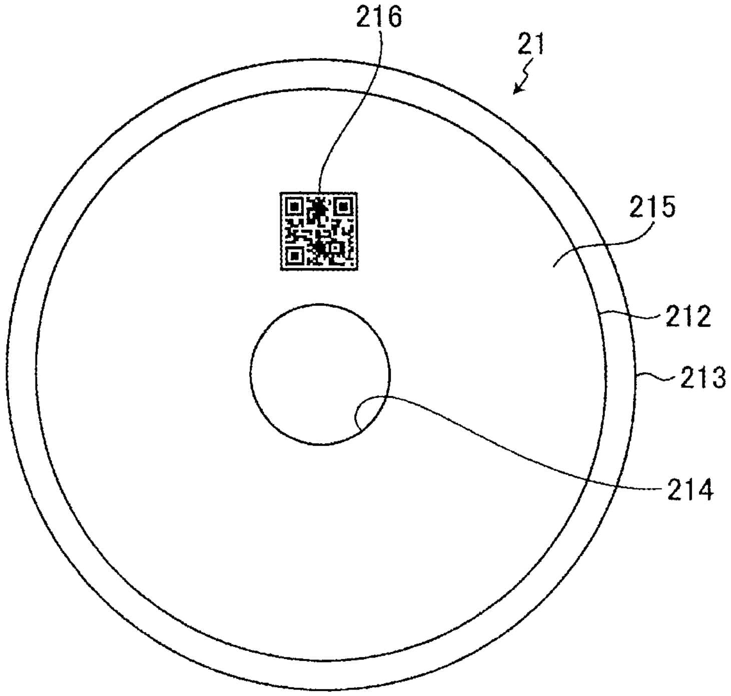
FIG. 6 is a rear elevational view of the cutting blade illustrated in FIG. 5.

The cutting units 20 will be described below. Since the two cutting units 20 are identical in structure to each other, only one of them will be described below. FIG. 4 illustrates, in cross section, a cutting unit of the cutting apparatus illustrated in FIG. 1. FIG. 5 illustrates, in front elevation, a cutting blade mounted on the cutting unit illustrated in FIG. 4. FIG. 6 illustrates, in rear elevation, the cutting blade illustrated in FIG. 5.

The cutting unit 20 represents cutting means on which the cutting blade 21 is detachably mounted as a consumable product for cutting the workpiece 200 held on the holding table 10 while supplying cutting water to the workpiece 200. The cutting unit 20 is movable with respect to the workpiece 200 held on the holding table 10 along the Y-axis by the Y-axis moving unit and along the Z-axis by the Z-axis moving unit.

The two cutting units 20 are disposed on respective posts of a portal-shaped support frame, not illustrated, erected on an apparatus body 2 by the Y-axis moving unit and the Z-axis moving unit. The cutting units 20 are able to place the respective cutting blades 21 at desired positions on the holding surface 11 of the holding table 10 with the Y-axis moving unit and the Z-axis moving unit.

As illustrated in FIG. 4, the cutting unit 20 has a spindle housing 22 (see FIG. 1) that is movable along the Y-axis and the Z-axis by the Y-axis moving unit and the Z-axis moving unit, a spindle 23 rotatably housed in the spindle housing 22 and rotatable about its central axis by an electric motor, not illustrated, and a mount flange 24 mounted on a distal end portion of the spindle 23. The cutting blade 21 is mounted on the distal end portion of the spindle 23 by the mount flange 24.

According to the present embodiment, the distal end portion of the spindle 23 is of a conical shape that is progressively smaller in diameter toward its tip end. A diametrical suction channel 231 is defined in the distal end portion of the spindle 23 and is fluidly connected to a vacuum suction source, not illustrated. The diametrical suction channel 231 has opposite outer ends open at an outer circumferential surface of the distal end portion of the spindle 23. An internally threaded hole 232 for receiving a bolt 25 threadedly inserted therein is axially defined in the distal end portion of the spindle 23 and is open at a tip end face of the spindle 23.

The mount flange 24 includes a hollow cylindrical boss 241 and a flange 242 protruding radially outwardly from the boss 241 and disposed axially centrally on the boss 241. The boss 241 houses the distal end portion of the spindle 23 inserted in an axial end portion 243 thereof and also houses the bolt 25 inserted in another axial end portion 244. The axial end portion 243 of the boss 241 has an inner circumferential surface progressively smaller in diameter toward the other axial end portion 244 such that the outer circumferential surface of the distal end portion of the spindle 23 can be held in intimate contact with the inner circumferential surface of the axial end portion 243 of the boss 241. The axial end portion 243 of the boss 241 is larger in outside diameter than the other axial end portion 244. The other axial end portion 244 of the boss 241 has a washer bearing surface 245 defined radially therein. When the bolt 25 is threaded into the internally threaded hole 232, the bolt 25 has a shank extending through a washer 26 held against the washer bearing surface 245 and a head resting on the washer 26.

The flange 242 is of an annular shape that is larger in outside diameter than the boss 241. The flange 242 includes a mounting land 246 extending fully circumferentially along an outer edge portion thereof and protruding axially toward the other axial end portion 244 side. The mounting land 246 has a surface 247 functioning as a holding surface for holding the cutting blade 21 thereon and lying perpendicular to the axis of the mount flange 24. Therefore, the mount flange 24 has the surface 247 of the mounting land 246.

The mount flange 24 is mounted on the distal end portion of the spindle 23 as illustrated in FIG. 4 when the distal end portion of the spindle 23 is housed in the axial end portion 243 of the boss 241 and the bolt 25 is inserted through the washer 26 placed on the washer bearing surface 245 and threaded into the internally threaded hole 232. The mount flange 24 has a suction channel 249 defined therein that is open at an inner circumferential surface of the axial end portion 243 of the boss 241 and a surface 248 of the flange 242 that is positioned radially inwardly of the mounting land 246. The suction channel 249 is brought into fluid communication with the suction channel 231 in the spindle 23 when the mount flange 24 is mounted on the distal end portion of the spindle 23.

The cutting blade 21 includes an ultrathin cutting grindstone having a substantially ring shape. According to the present embodiment, the cutting blade 21 is in the form of a hub blade. As illustrated in FIGS. 4, 5, and 6, the cutting blade 21 includes an annular support base 212 made of a metal material such as aluminum alloy or the like and an annular cutting edge 213 fixed to an outer circumferential portion of the support base 212 for cutting the workpiece 200. The support base 212 has a central mounting hole 214 defined therein that receives the boss 241 of the mount flange 24 therein. When the cutting blade 21 is mounted on the mount flange 24, the boss 241 is axially inserted through the mounting hole 214 in the support base 212. The cutting edge 213 is made of abrasive grains of diamond, cubic boron nitride (CBN), or the like dispersed in a bonding material, i.e., a binder, metal, resin, or the like. The cutting edge 213 has a predetermined thickness.

The cutting unit 20 of the above structure is assembled as follows. The mounting hole 214 in the support base 212 of the cutting blade 21 is fitted over the other axial end portion 244 of the boss 241 of the mount flange 24 mounted on the distal end portion of the spindle 23. At this time, the support base 212 is held in intimate contact with the surface 247 of the mounting land 246 of the support base 212. The vacuum suction source fluidly connected to the suction channel 231 is actuated to generated and transmit a suction force through the suction channels 231 and 249 into a space defined between the surface 248 of the flange 242, the mounting land 246, and a reverse side 215 of the support base 212, securing the cutting blade 21 under suction to the mount flange 24.

The spindle 23, the mount flange 24, and the cutting blade 21 of the cutting unit 20 have respective central axes extending parallel to the Y-axis.

According to the present embodiment, the support base 212 has an identification mark 216 (see FIG. 6) applied to the reverse side 215 that faces the mount flange 24 at the time the cutting blade 21 is fixed to the mount flange 24. The identification mark 216 contains information indicating at least the kind of the cutting blade 21. In other words, the cutting blade 21 has the identification mark 216. According to the present embodiment, the identification mark 216 represents a well-known two-dimensional code though it may be a one-dimensional code. The identification mark 216 may be in the form of a graphic figure, numerals, characters, or a combination thereof.

The image capturing unit is fixed to the cutting unit 20 for movement in unison with the cutting unit 20. The image capturing unit includes an image capturing device for capturing an image of a region to be divided of the workpiece 200 held on the holding table 10. The image capturing device includes a charge-coupled-device (CCD) image sensor or a complementary-MOS (CMOS) image sensor, for example. The image capturing unit captures an image of the workpiece 200 held on the holding table 10 to be used in an alignment process for positioning the workpiece 200 and the cutting blade 21 in alignment with each other, and outputs the captured image to the controller 100.

The X-axis moving unit moves the holding table 10 in a processing-feed direction along the X-axis to processing-feed the holding table 10 and the cutting units 20 relatively to each other along the X-axis. The Y-axis moving unit moves the cutting units 20 in an indexing-feed direction along the Y-axis to indexing-feed the holding table 10 and the cutting units 20 relatively to each other along the Y-axis. The Z-axis moving unit moves the cutting units 20 in an incising-feed direction along the Z-axis to incising-feed the holding table 10 and the cutting units 20 relatively to each other along the Z-axis.

Each of the X-axis moving unit, the Y-axis moving unit, and the Z-axis moving unit includes a known ball screw rotatable about its central axis, a known electric motor for rotating the ball screw about its central axis, and known guide rails on which the holding table 10 or the cutting units 20 are movably supported for movement along the X-axis, the Y-axis, or the Z-axis. The rotating unit includes an electric motor, etc. for rotating the holding table 10 about the vertical central axis along the Z-axis.

The cutting apparatus 1 further includes an X-axis position detecting unit, not illustrated, for detecting the position of the holding table 10 along the X-axis, a Y-axis position detecting unit, not illustrated, for detecting the position of the cutting units 20 along the Y-axis, and a Z-axis position detecting unit, not illustrated, for detecting the position of the cutting units 20 along the Z-axis. Each of the X-axis position detecting unit and the Y-axis position detecting unit may include a linear scale parallel to the X-axis or the Y-axis and a reading head. The Z-axis position detecting unit detects the position of the cutting units 20 on the basis of pulses of a control signal supplied to the electric motor of the Z-axis moving unit. The X-axis position detecting unit, the Y-axis position detecting unit, and the Z-axis position detecting unit output the detected position of the holding table 10 along the X-axis, the detected position of the cutting units 20 along the Y-axis, and the detected position of the cutting units 20 along the Z-axis to the controller 100.

As illustrated in FIG. 1, the cutting apparatus 1 includes a storage chamber 40, a cassette rest base 50 on which the storage chamber 40 is installed, a cassette 51 placed on the storage chamber 40, a table cover 60 functioning as a temporary rest, a cleaning unit 70 for cleaning a workpiece 200 after it has been cut, and a pair of delivery units 80 as delivery means.

Figure 7:
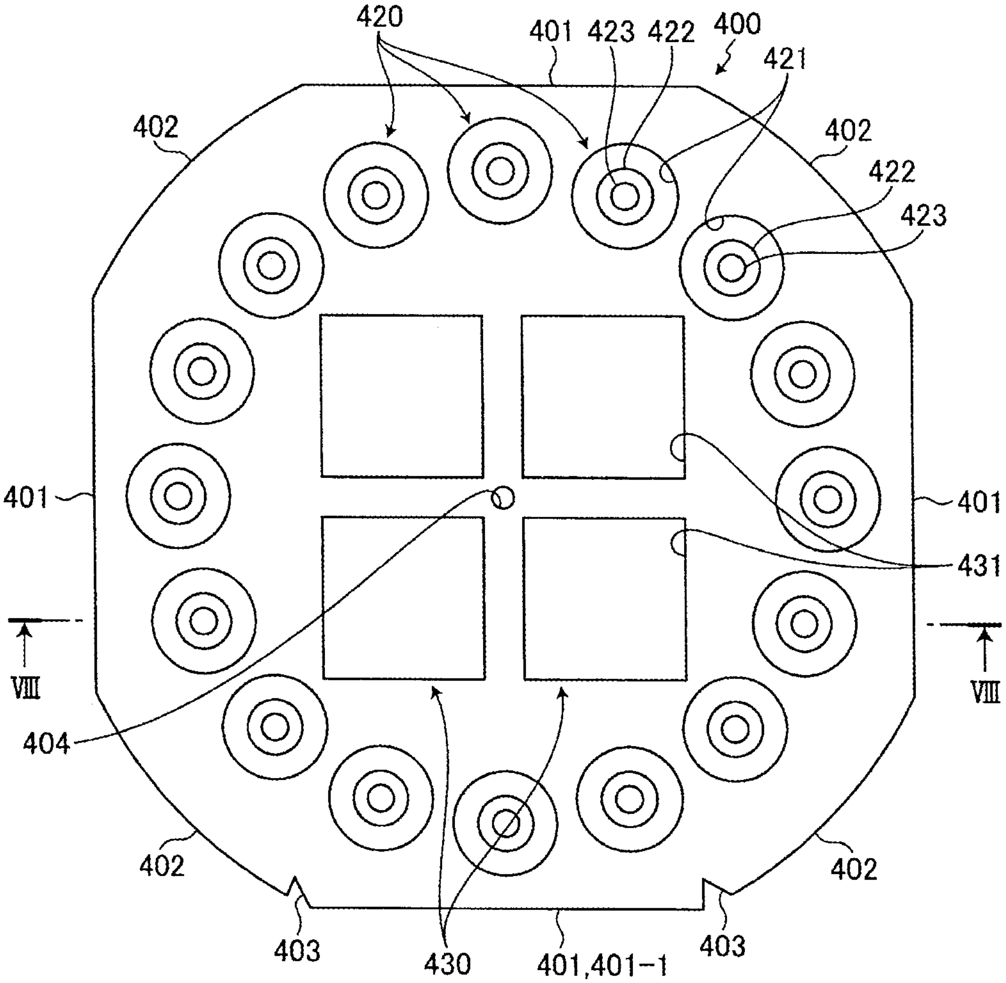
FIG. 7 is a plan view illustrating a structural example of a storage tray stored in a storage chamber of the cutting apparatus illustrated in FIG. 1.
Figure 8:
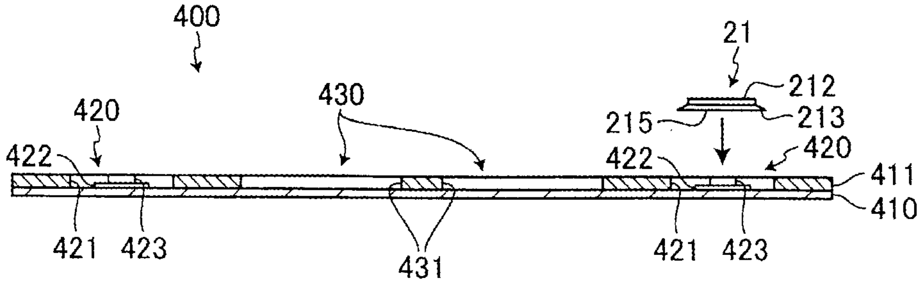
FIG. 8 is a cross-sectional view taken along line VIII-VIII of FIG. 7.
Figure 9:
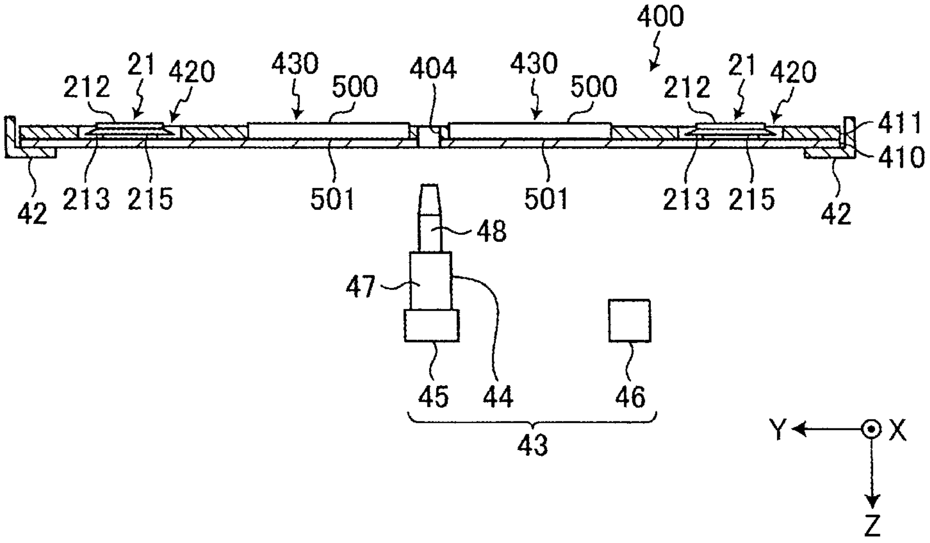
FIG. 9 is a cross-sectional view schematically illustrating, partly in side elevation, the interior of the storage chamber illustrated in FIG. 1.
Figure 10:
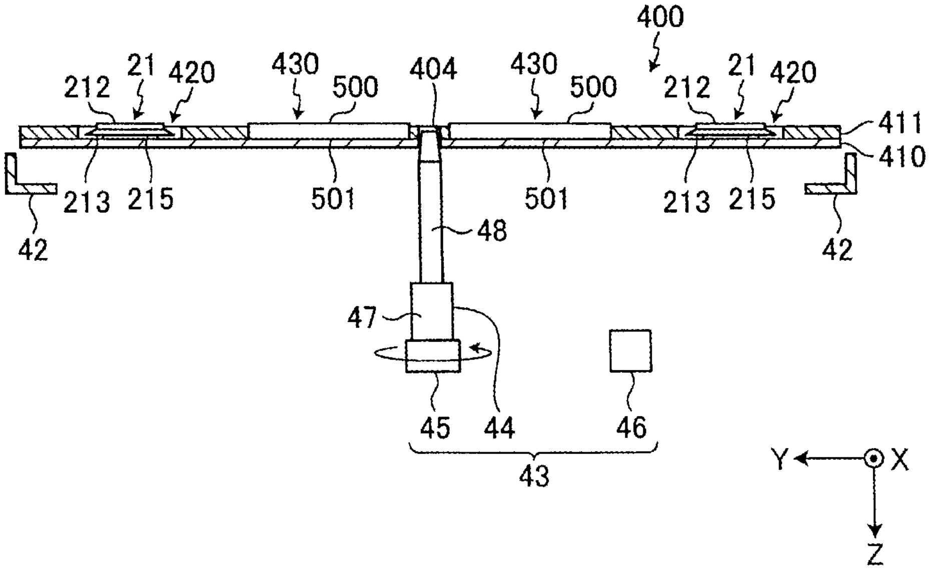
FIG. 10 is a cross-sectional view schematically illustrating, partly in side elevation, the manner in which a reading unit in the storage chamber illustrated in FIG. 9 reads an identification mark.

The storage chamber 40 will be described below. FIG. 7 illustrates, in plan, a structural example of a storage tray to be housed in the storage chamber 40 of the cutting apparatus 1 illustrated in FIG. 1. FIG. 8 illustrates a cross section taken along line VIII-VIII of FIG. 7. FIG. 9 schematically illustrates, in cross section, partly in side elevation, the interior of the storage chamber 40 illustrated in FIG. 1. FIG. 10 schematically illustrates, in cross section, partly in side elevation, the manner in which a reading unit in the storage chamber 40 illustrated in FIG. 9 reads the identification mark 216.

The storage chamber 40 is shaped as a box for storing therein a storage tray 400 illustrated in FIGS. 7 and 8. The storage tray 400 can be taken into and out of the storage chamber 40 through an opening, not illustrated, defined in a side wall thereof that faces the cleaning unit 70. The operator can manually bring the storage tray 400 into or out of the storage chamber 40 through an opening in a side wall thereof that faces away from the cleaning unit 70 by opening and closing a lid 49 (see FIG. 1) positioned remotely from the cleaning unit 70. The storage tray 400 stores cutting blades 21 to be mounted on the spindles 23 of the cutting units 20 and dressing boards 500 to be held on the sub-chuck table 15. The storage tray 400 also functions as a jig for transporting cutting blades 21 and a dressing board 500 from the storage chamber 40 to a position over the table cover 60 that covers the holding table 10 in the loading and unloading position at the time the cutting blades 21 mounted on the cutting units 20 and the dressing board 500 held on the sub-chuck table 15 are to be replaced.

The storage tray 400 is of a plate shape having an outer edge whose planar shape is the same as the planar shape of the outer edge of the annular frame 211. Therefore, the storage tray 400 has an outer edge including two pairs of diametrically opposite straight edge portions 401 extending parallel to each other and two pairs of diametrically opposite arcuate edge portions 402 each disposed between adjacent two of the straight edge portions 401. According to the present embodiment, one of the straight edge portions 401 (hereinafter denoted by 401-1) has two notches 403 defined respectively at its opposite ends. The notches 403 extend from the outer edge of the storage tray 400 radially inwardly of the storage tray 400.

As illustrated in FIG. 8, the storage tray 400 includes a transparent plate 410 made of a transparent material such as glass or resin and having a uniform thickness and a hard plate 411 laminated on the transparent plate 410 and having a uniform thickness. The hard plate 411 is made of a metal material such as tungsten steel, for example, and is uniform in thickness.

The hard plate 411 has a plurality of blade storage regions 420 for storing respective cutting blades 21 as consumable products and a plurality of board storage regions 430 for storing respective dressing boards 500 as consumable products. In other words, the storage tray 400 has a plurality of blade storage regions 420 and plurality of board storage regions 430, both also referred to as storage regions.

According to the present embodiment, the blade storage regions 420 are disposed in an outer edge portion of the hard plate 411 at angularly spaced intervals along an outer edge of the storage tray 400, and the board storage regions 430 are disposed in a central portion of the hard plate 411. According to the present embodiment, each of the blade storage regions 420 includes a circular hole 421 extending through the hard plate 411, a spacer 422 disposed in the circular hole 421, and a boss 423 protruding from the spacer 422.

The circular hole 421 is of a circular planar shape and has a diameter larger than the outside diameter of the cutting edge 213. The spacer 422 is shaped as a thin circular plate having a diameter smaller than the outside diameter of the cutting edge 213 and the outside diameter of the support base 212. The spacer 422 is thinner than the hard plate 411. The spacer 422 is disposed in the circular hole 421 coaxially therewith, and is fixed to the transparent plate 410. The boss 423 is shaped as a cylindrical post having a diameter slightly smaller than the diameter of the mounting hole 214 in the cutting blades 21. The boss 423 is fixed to the spacer 422 coaxially therewith. The blade storage regions 420 store the respective cutting blades 21 such that the boss 423 are inserted in the mounting holes 214, the reverse sides 215 are superposed on the spacers 422, and the cutting blades 21 are housed in the circular holes 421.

According to the present embodiment, a cutting blade 21 that is a consumable product is stored in one of the blade storage regions 420 of the storage tray 400 such that the identification mark 216 of the cutting blade 21 faces the bottom surface of the circular hole 421 of the blade storage region 420. When the blade storage region 420 stores the cutting blade 21, the spacer 422 abuts against the reverse side 215 of the support base 212 to prevent the cutting edge 213 from contacting the transparent plate 410, i.e., the bottom surface of the circular hole 421. When the blade storage region 420 stores the cutting blade 21, in addition, the identification mark 216 does not overlap the spacer 422.

According to the present embodiment, each of the board storage regions 430 is defined by a rectangular hole 431 extending through the hard plate 411. The rectangular hole 431 is shaped as a rectangular hole that is essentially identical in planar shape to the dressing board 500. The board storage regions 430 store respective dressing boards 500 placed on the transparent plate 410 in the rectangular holes 431. The dressing boards 500 are stored in the board storage regions 430 with their identification marks 502 superposed on the transparent plate 410.

According to the present embodiment, therefore, the dressing boards 500 as consumable products are stored in the board storage regions 430 of the storage tray 400 such that the identification marks 502 face the bottom surfaces of the rectangular holes 431 in the storage tray 400. When the blade storage regions 420 store the respective cutting blades 21 therein, since the identification marks 216 of the cutting blades 21 do not overlap the spacers 422, those regions of the storage tray 400 that lie under, or are aligned with, the identification marks 216 and 502 of the cutting blades 21 and the dressing boards 500 that are stored in the storage regions 420 and 430 are provided by the transparent plate 410. According to the present specification, storing the cutting blades 21 and the dressing boards 500 in the storage regions 420 and 430 with the identification marks 216 and 502 facing the transparent plate 410 is equivalent to storing the cutting blades 21 and the dressing boards 500 in the storage regions 420 and 430 with the identification marks 216 and 502 abutting against the storage tray 400.

The storage tray 400 of the foregoing structure can be stored in the storage chamber 40 while the cutting blades 21 and the dressing boards 500 are being stored in the storage regions 420 and 430, and can be delivered in the same manner as the annular frame 211 by the delivery unit 80. In other words, the storage tray 400 can be delivered between the storage chamber 40 and a position above the holding table 10 by the delivery unit 80 that is shared by the workpiece 200. The storage tray 400 has a circular through hole 404 that extends through the transparent plate 410 and the hard plate 411.

The storage chamber 40 that is placed on the cassette rest base 50 below the cassette 51 is vertically movable, i.e., liftable and lowerable, together with the cassette rest base 50 along the Z-axis. The storage chamber 40 stores storage trays 400 therein in such an orientation that the straight edge portion 401-1 of each of the storage trays 400 with the notches 403 on its opposite ends is positioned closer to the opening in the side wall of the storage chamber 40 that faces the cleaning unit 70 than the other straight edge portions 401. As illustrated in FIGS. 9 and 10, the storage chamber 40 includes a flat box-shaped chamber casing 41 (see FIG. 1) with the openings defined in side walls thereof through which the storage trays 400 can be taken into and out of the chamber casing 41, vertically spaced pairs of support shelves 42 disposed in the chamber casing 41, and a reading unit 43.

The support shelves 42 in each pair extend straight along the X-axis and are horizontally spaced along the Y-axis. As illustrated in FIG. 9, the support shelves 42 in each pair support the respective ends of one of the storage trays 400 along the Y-axis.

The reading unit 43 reads the identification marks 216 and 502 of the cutting blades 21 and the dressing boards 500 that are stored in the storage regions 420 and 430 of each of the storage trays 400 stored in the storage chamber 40. According to the present embodiment, the reading unit 43 is disposed in the storage chamber 40 below the support shelves 42, and includes a lifting and lowering cylinder 44, a rotary actuator 45, and an image capturing camera 46.

As illustrated in FIG. 10, the lifting and lowering cylinder 44 includes a cylinder body 47 disposed below the support shelves 42 and fixed to the chamber casing 41 and a rod 48 extendible from and contractible toward the cylinder body 47 along the Z-axis. When extended along the Z-axis, the rod 48 has its upper end fitted into the through hole 404 of the storage tray 400 and lifts the storage tray 400 in the storage chamber 40. When the rotary actuator 45 is energized, it rotates the lifting and lowering cylinder 44 about its central axis along the Z-axis.

The image capturing camera 46 captures images of the identification marks 216 and 502 of the cutting blades 21 and the dressing boards 500 through the storage tray 400 that has been lifted by the lifting and lowering cylinder 44 and rotated by the rotary actuator 45 in the storage chamber 40, and outputs the captured images to the controller 100. The image capturing camera 46 includes a CCD image sensor or a CMOS image sensor for capturing images of the identification marks 216 and 502.

The cassette 51 includes a box-shaped container for storing workpieces 200. Specifically, the cassette 51 stores a plurality of workpieces 200, which may have yet to be cut or may have been cut, on pairs of support shelves 52 that are vertically spaced along the Z-axis. Workpieces 200 can be taken out of or into the cassette 51 through an opening defined in a side wall thereof that faces the cleaning unit 70. The cassette 51 is placed on the storage chamber 40. The cassette 51 stores the workpieces 200 therein in such an orientation that the straight edge portion 221-1 of each of the annular frames 211 with the notches 223 on its opposite ends is positioned closer to the opening in the side wall of the cassette 51 that faces the cleaning unit 70 than the other straight edge portions 221.

The cassette rest base 50 vertically moves, i.e., lifts and lowers, the storage chamber 40 and the cassette 51 along the Z-axis.

The table cover 60 is disposed next to the holding table 10 that is in the loading and unloading position along the Y-axis. The table cover 60, which is shaped as a flat plate, is pivotally mounted on an outer edge portion of the apparatus body 2 by a hinge 61 for pivotal movement about the hinge 61. The table cover 60 is pivotally movable by an actuator, not illustrated, between a standby position indicated by the solid lines in FIG. 1 where the table cover 60 has opposite surfaces extending vertically parallel to the Z-axis and stays retracted from the holding surface 11 of the holding table 10 and a table protecting position indicated by the two-dot-and-dash lines in FIG. 1 where the opposite surfaces of the table cover 60 extend horizontally along the X-axis and the Y-axis and overlap the holding surface 11 of the holding table 10. When cutting blades 21 and dressing boards 500 are to be replaced, the table cover 60 is placed in the table protecting position, and a storage tray 400 is temporarily placed on the table cover 60. When the table cover 60 is placed in the table protecting position, the upper surface 16 of the sub-chuck table 15 is left exposed, not covered by the table cover 60.

The cleaning unit 70 includes a spinner table 71 for holding a workpiece 200 under suction thereon, the spinner table 71 being rotatable about its central axis along the X-axis, and a cleaning liquid supply nozzle, not illustrated, for supplying a cleaning liquid to the workpiece 200 held under suction on the spinner table 71. The cleaning unit 70 is disposed next to the cassette rest base 50, i.e., the cassette 51 and the storage chamber 40, along the X-axis, and also next to the holding table 10 that is in the loading and unloading position along the Y-axis.

When a workpiece 200 on the holding table 10 is to be cut by the cutting units 20, the delivery unit 80 delivers the workpiece 200 from the cassette 51 onto the holding table 10. When the workpiece 200 on the holding table 10 has been cut by the cutting units 20, the delivery unit 80 delivers the workpiece 200 from the holding table 10 to the cleaning unit 70 and then from the cleaning unit 70 back into the cassette 51. When cutting blades 21 and dressing boards 500 are to be replaced, the cleaning unit 70 delivers a storage tray 400 from the storage chamber 40 onto the table cover 60 that is in the table protecting position. When cutting blades 21 and dressing boards 500 have been replaced, the cleaning unit 70 delivers the storage tray 400 from the table cover 60 back into the storage chamber 40.

As illustrated in FIG. 1, the delivery unit 80 includes a pair of delivery arms 81 and a pair of centering guides 82. According to the present embodiment, each of the delivery arms 81 includes a cylinder unit 83 movably mounted on the apparatus body 2 for movement along the X-axis and the Y-axis and extending downwardly and a suction hand 85 mounted on a downwardly extending rod 84 of the cylinder unit 83. The rod 84 of the cylinder unit 83 is vertically extendible and contractible along the Z-axis. The suction hand 85 is able to hold an annular frame 211 under suction thereon and also to hold the outer edge of a storage tray 400 under suction thereon. To the suction hand 85 of one of the delivery arms 81, there is attached a loading and unloading unit 86 for holding the outer edge of an annular frame 211 or a storage tray 400 and bringing the workpiece 200 into and out of the cassette 51 and bringing the storage tray 400 into and out of the storage chamber 40.

The centering guides 82 are disposed next to the cassette rest base 50, i.e., the cassette 51 and the storage chamber 40, along the X-axis and are spaced from each other along the Y-axis. The centering guides 82 extend straight along the X-axis. Each of the centering guides 82 includes a support wall 87 for supporting an annular frame 211 and a storage tray 400 placed on an upper surface thereof and a positioning wall 88 erected from an edge of the support wall 87 that is remote from the other centering guide 82. The centering guides 82 are movable toward and away from each other along the Y-axis by an actuating mechanism, not illustrated.

The delivery unit 80 operates as follows. While the centering guides 82 are spaced from each other, one of the delivery arms 81 is moved and the rod 84 of the cylinder unit 83 thereof is extended and contracted to enable the loading and unloading unit 86 to hold an annular frame 211 supporting a workpiece 200 in the cassette 51 and unload the annular frame 211 supporting the workpiece 200 from the cassette 51 onto the support walls 87 of the entering guides 82. Similarly, the loading and unloading unit 86 otherwise holds a storage tray 400 in the storage chamber 40 and unloads the storage tray 400 from the storage chamber 40 onto the support walls 87 of the entering guides 82.

Then, the centering guides 82 are moved toward each other to cause the positioning walls 88 to position the workpiece 200 or the storage tray 400 along the Y-axis. The suction hand 85 of one of the delivery arms 81 holds the annular frame 211 or the storage tray 400 under suction. The cylinder unit 83 is moved along the Y-axis and the rod 84 thereof is extended and contracted to deliver the workpiece 200 onto the holding surface 11 of the holding table 10 or to deliver the storage tray 400 onto the table cover 60 that is in the table protecting position.

The other delivery arm 81 delivers the workpiece 200 that has been cut from the holding table 10 onto the spinner table 71 of the cleaning unit 70. Thereafter, the other delivery arm 81 delivers the workpiece 200 that has been cleaned from the spinner table 71 onto the support walls 87 of the centering guides 82, after which the loading and unloading unit 86 stores the workpiece 200 back into the cassette 51. One of the delivery arms 81 delivers the storage tray 400 from the table cover 60 onto the support walls 87 of the centering guides 82, after which the loading and unloading unit 86 stores the storage tray 400 back into the storage chamber 40.

Figure 11:
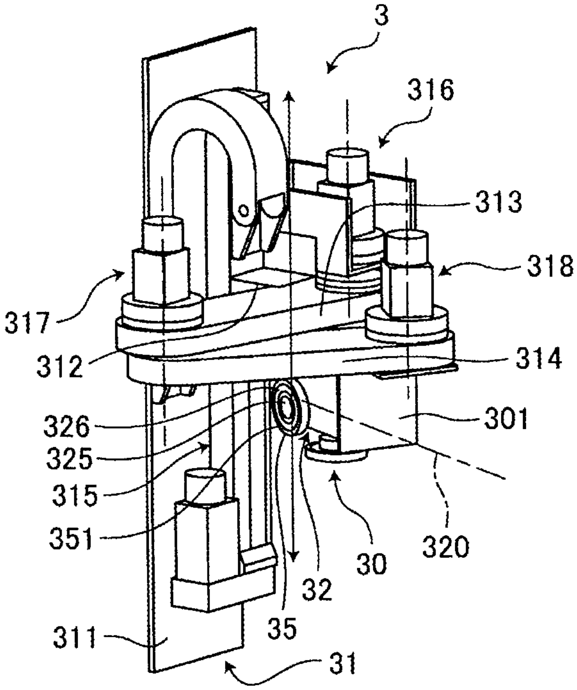
FIG. 11 is a perspective view illustrating a structural example of a replacing mechanism of the cutting apparatus illustrated in FIG. 1.
Figure 12:
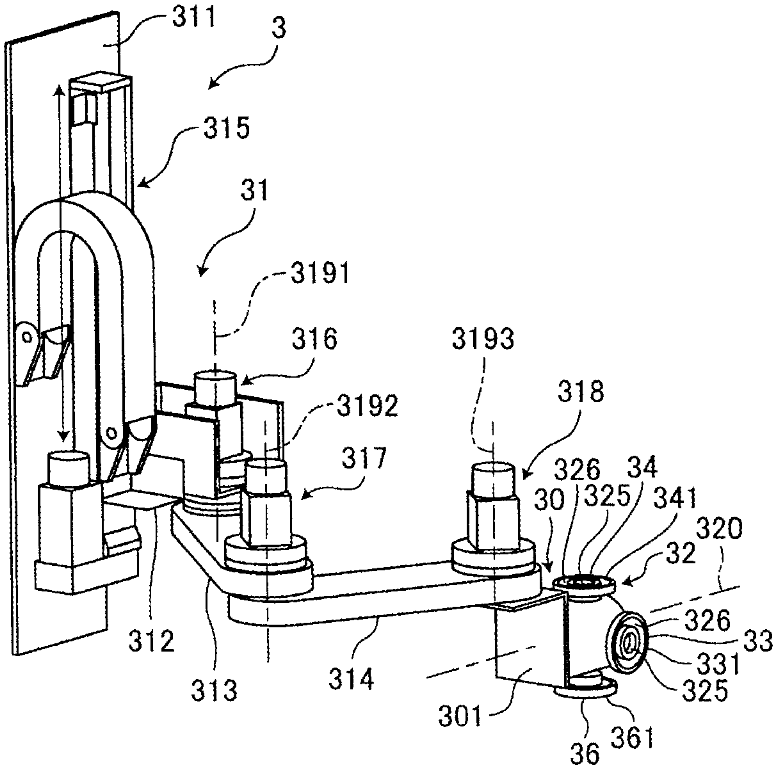
FIG. 12 is another perspective view illustrating the structural example of the replacing mechanism illustrated in FIG. 11.

The replacing mechanism 3 will be described in detail below with reference to the drawings. FIG. 11 illustrates, in perspective, a structural example of the replacing mechanism 3 of the cutting apparatus 1 illustrated in FIG. 1. FIG. 12 also illustrates, in perspective, the structural example of the replacing mechanism 3 illustrated in FIG. 11.

The replacing mechanism 3 replaces cutting blades 21 and dressing boards 500, i.e., replaces consumable products including cutting blades 21. As illustrated in FIGS. 1, 11, and 12, the replacing mechanism 3 includes a replacing device 30 for replacing the cutting blades 21 mounted on the cutting units 20 and a dressing board 500 held on the sub-chuck table 15, and a moving unit 31. According to the present embodiment, the replacing mechanism 3 is disposed next to the holding table 10 that is in the loading and unloading position along the Y-axis, with the table cover 60 interposed between the replacing mechanism 3 and the holding table 10.

The moving unit 31 moves the replacing device 30 between a standby position, illustrated in FIGS. 1 and 11, where the replacing device 30 is retracted from the cutting units 20 and the position above the holding surface 11 of the holding table 10 and a replacing position illustrated in FIG. 12, where the replacing device 30 replaces the cutting blades 21 mounted on the cutting units 20 and a dressing board 500 held on the sub-chuck table 15.

According to the present embodiment, the moving unit 31 includes a base 311 fixed to the apparatus body 2, etc., a lifting and lowering member 312, a first rotary arm 313, a second rotary arm 314, a lifting and lowering mechanism 315, a first rotating mechanism 316, a second rotating mechanism 317, and a third rotating mechanism 318. The base 311 is of a straight shape along the Z-axis, and, according to the present embodiment, extends upwardly from an upper surface of the apparatus body 2. The lifting and lowering member 312 is movably mounted on the base 311 for vertical movement along the Z-axis.

The first rotary arm 313 and the second rotary arm 314 extend straight. The first rotary arm 313 has an end portion rotatably supported on the lifting and lowering member 312 for rotational movement about a first rotational axis 3191 extending vertically through the end portion of the first rotary arm 313 along the Z-axis. The other end portion of the first rotary arm 313 and an end portion of the second rotary arm 314 are rotatably coupled to each other for rotational movement about a second rotational axis 3192 extending vertically through these end portions of the first rotary arm 313 and the second rotary arm 314 along the Z-axis. The other end portion of the second rotary arm 314 supports the replacing device 30 such that the replacing device 30 is rotatable about a third rotational axis 3193 extending vertically through the other end portion of the second rotary arm 314 along the Z-axis.

The lifting and lowering mechanism 315 moves the lifting and lowering member 312 with respect to the base 311 vertically along the Z-axis. The first rotating mechanism 316 rotates the first rotary arm 313 with respect to the lifting and lowering member 312 about the first rotational axis 3191. The second rotating mechanism 317 rotates the first rotary arm 313 and the second rotary arm 314 with respect to each other about the second rotational axis 3192. The third rotating mechanism 318 rotate the replacing device 30 with respect to the second rotary arm 314 about the third rotational axis 3193.

The replacing device 30 includes a device body 301, a rotating mechanism, not illustrated, and a replacing unit 32. The device body 301 is rotatably supported on the other end portion of the second rotary arm 314 for rotation about the third rotational axis 3193, and is rotated about the third rotational axis 3193 by the third rotating mechanism 318. The rotating mechanism rotates the replacing unit 32 with respect to the device body 301 about a horizontal axis 320 extending through the replacing unit 32 and the device body 301.

The replacing unit 32 includes a rotational shaft, not illustrated, rotatable about the axis 320 by the rotating mechanism, a first holder 33 (see FIG. 12), a second holder 34 (see FIG. 12), a third holder 35 (see FIG. 11), and a fourth holder 36 (see FIG. 12) that are mounted on the rotational shaft.

The first through fourth holders 33 and 34, 35, and 36 are disposed at equal spaced intervals around the rotational shaft. Each of the first through fourth holders 33, 34, 35, and 36 is shaped as a circular plate whose central axis extends perpendicularly to the axis 320. The respective axes of adjacent two of the first through fourth holders 33, 34, 35, and 36 extend perpendicularly to each other. The first through fourth holders 33, 34, 35, and 36 have respective holding surfaces 331, 341, 351, and 361 for holding cutting blades 21 and dressing boards 500 under suction around the axis 320.

According to the present embodiment, the first through fourth holders 33, 34, 35, and 36 hold a face side 217 (see FIG. 4), opposite the reverse side 215, of the support base 212 of a cutting blade 21 and an upper surface 503 (see FIG. 3) of a dressing board 500 under suction on the respective holding surfaces 331, 341, 351, and 361. According to the present embodiment, the first through fourth holders 33, 34, 35, and 36 have mount holes 325 defined centrally in the respective holding surfaces 331, 341, 351, and 361, each for receiving therein the other axial end portion 244 of the boss 241 of the mount flange 24 of a cutting blade 21. The first through fourth holders 33, 34, 35, and 36 also have suction holding grooves 326 defined in the respective holding surfaces 331, 341, 351, and 361 around the mount holes 325, each for applying a suction force generated by and transmitted from a vacuum suction source, not illustrated, to hold the support base 212 of a cutting blade 21 and a dressing board 500 under suction on the holding surfaces 331, 341, 351, and 361. According to the present embodiment, each of the first through fourth holders 33, 34, 35, and 36 holds the face side 217 of the support base 212 of a cutting blade 21 under suction. According to the present invention, however, each of the first through fourth holders 33, 34, 35, and 36 may hold a cutting blade 21 in other ways.

The replacing mechanism 3 operates as follows. While the cutting apparatus 1 is to perform a cutting process, the moving unit 31 brings the end portion of the first rotary arm 313 and the other end portion of the second rotary arm 314 closely to each other, causing the replacing device 30 to face the base 311 and position itself in the standby position illustrated in FIGS. 1 and 11. For replacing the cutting blades 21 on the respective cutting units 20 and for replacing the dressing board 500 held on the sub-chuck table 15, the moving unit 31 brings the end portion of the first rotary arm 313 and the other end portion of the second rotary arm 314 away from each other, causing the replacing device 30 to face the cutting units 20 position itself in the replacing position illustrated in FIG. 12.

The controller 100 controls the components described above of the cutting apparatus 1 to enable the cutting apparatus 1 to perform a processing operation on workpieces 200. Specifically, the controller 100 controls at least the cutting units 20 and the replacing mechanism 3. The controller 100 includes, for example, a computer including a processing device having a microprocessor such as a central processing unit (CPU), a storage device having a memory such as a read only memory (ROM) or a random access memory (RAM), and an input/output interface device. The processing device of the controller 100 performs processing sequences according to computer programs stored in the storage device to generate control signals for controlling the cutting apparatus 1 and outputs the control signals to the components of the cutting apparatus 1 through the input/output interface device.

The controller 100 is electrically connected to a display unit, not illustrated, such as a liquid crystal display device for displaying states and images of processing operations, and an input unit that can be used by the operator to enter processing content information, etc. The input unit includes at least either a touch panel incorporated in the display unit or an external input device such as a keyboard.

As illustrated in FIG. 1, the controller 100 includes an operation controlling section 101, a storage section 102, and a replacement product position storage section 103. The operation controlling section 101 controls the components of the cutting apparatus 1 to enable the cutting apparatus 1 to perform a processing operation on workpieces 200.

The storage section 102 stores processing conditions, etc. entered from the input unit. The processing conditions include kinds of cutting blades 21 and kinds of dressing boards 500. Specifically, the storage section 102 stores information representing kinds of cutting blades 21 to be mounted on the spindles 23 of the cutting units 20 and information representing kinds of dressing boards 500 to be held on the sub-chuck table 15.

The replacement product position storage section 103 ascertains and stores which storage regions 420 and 430 of storage tray 400 store cutting blades 21 and a dressing board 500 to be used in the cutting apparatus 1 on the basis of the identification marks 216 and 502 read by the reading unit 43. According to the present embodiment, the operation controlling section 101 of the controller 100 acquires an image captured by the image capturing camera 46 after the lifting and lowering cylinder 44 in the storage chamber 40 has extended the rod 48 to cause an upper end portion thereof fit into the through hole 404 of the storage tray 400 and then lift the storage tray 400 and also acquires an angle through which the lifting and lowering cylinder 44 has been rotated by the rotary actuator 45 from the position before the storage tray 400 is lifted.

The operation controlling section 101 identifies the kinds of the cutting blades 21 and the dressing board 500 stored in the storage regions 420 and 430 from the image and the angle that have been acquired, and stores the kinds of the cutting blades 21 and the dressing board 500 stored in the storage regions 420 and 430 in the replacement product position storage section 103. According to the present embodiment, the positions of the storage regions 420 and 430 are determined as positions relative to the notches 403.

The functions of the operation controlling section 101 are realized by the processing device when it performs processing sequences according to computer programs stored in the storage device. The functions of the storage section 102 and the replacement product position storage section 103 are realized by the storage device.

A mounting method according to the present embodiment will be described below. The mounting method according to the present embodiment refers to a method, performed by the cutting apparatus 1, of mounting cutting blades 21 and a dressing board 500 on the spindles 23 of the cutting units 20 and the sub-chuck table 15 of the cutting apparatus 1. According to the present embodiment, the mounting method also represents a method of replacing the cutting blades 21 mounted on the spindles 23 of the cutting units 20 of the cutting apparatus 1 and also represents a processing operation of the cutting apparatus 1.

Figure 13:
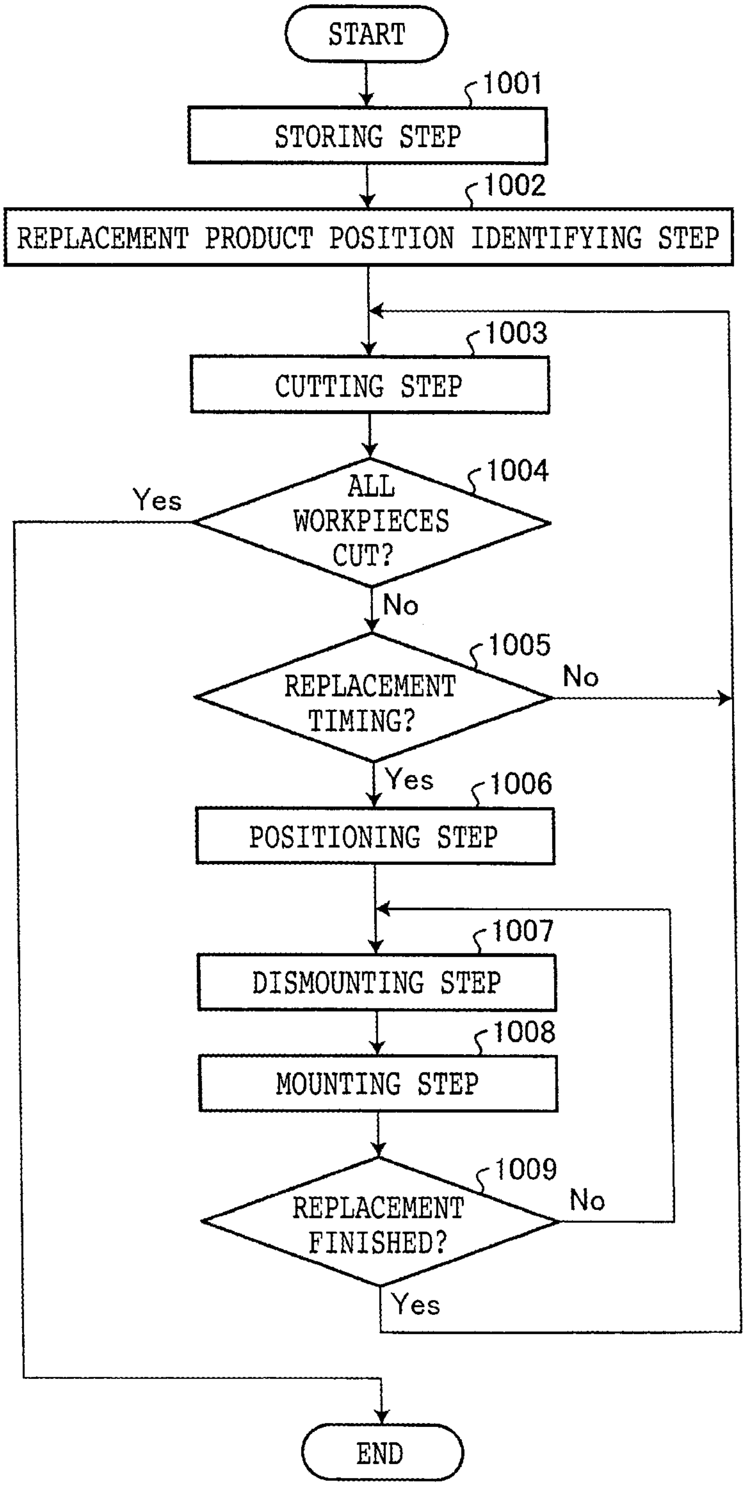
FIG. 13 is a flowchart of a sequence of a mounting method according to the embodiment.

FIG. 13 is a flowchart of the sequence of the mounting method according to the present embodiment. As illustrated in FIG. 13, the mounting method according to the present embodiment includes storing step 1001, replacement product position identifying step 1002, cutting step 1003, positioning step 1006, dismounting step 1007, and mounting step 1008.

Figure 14:
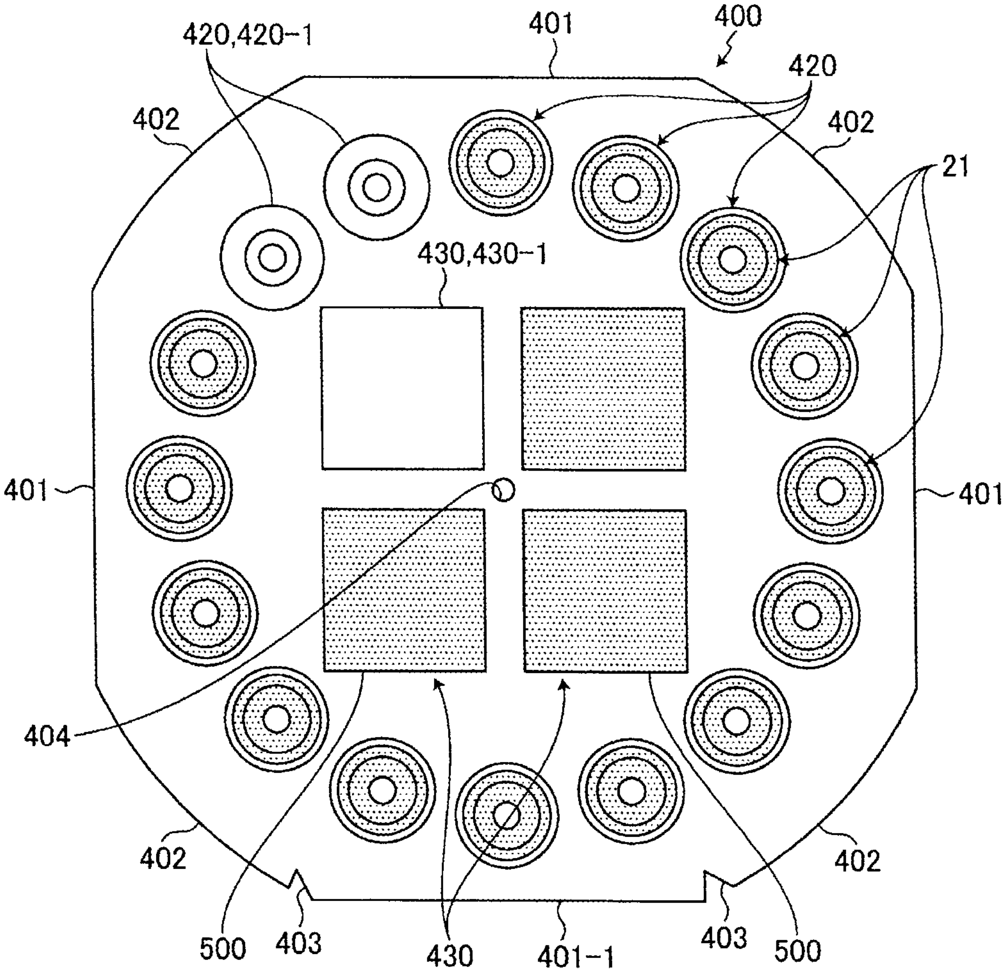
FIG. 14 is a plan view of the storage tray where cutting blades and dressing boards are stored in respective storage regions in a storing step of the mounting method illustrated in FIG. 13.

FIG. 14 illustrates, in plan, the storage tray 400 where cutting blades 21 and dressing boards 500 are stored in respective storage regions 420 and 430 in storing step 1001 of the mounting method illustrated in FIG. 13. Storing step 1001 is a step of storing cutting blades 21 and dressing boards 500 on the storage tray 400 that has a plurality of storage regions 420 and 430 for storing cutting blades 21 and dressing boards 500.

Figure 15:
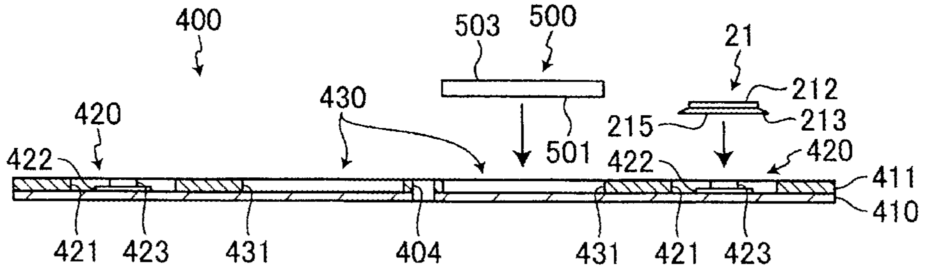
FIG. 15 is a cross-sectional view schematically illustrating the storage tray illustrated in FIG. 14.

According to the present embodiment, in storing step 1001, as illustrated in FIGS. 14 and 15, the operator or the like randomly stores cutting blades 21 and dressing boards 500 of various kinds into storage regions 420 and 430 of the storage tray 400. Specifically, the cutting blades 21 and the dressing boards 500 are stored in the storage regions 420 and 430 with the identification marks 216 and 502 facing the bottom surfaces of the storage regions 420 and 430.

Furthermore, as illustrated in FIG. 14, the cutting blades 21 and the dressing boards 500 are stored on the storage tray 400 such that no cutting blade 21 and no dressing board 500 are stored in at least one storage region 420, 430. Storage regions 420 and 430 where no cutting blade 21 and no dressing board 500 are stored will hereinafter be referred to as non-storing storage regions 420-1, 430-1. According to the present embodiment, there are two non-storing storage regions 420-1 and there is one non-storing storage region 430-1 on the storage tray 400, with the cutting blades 21 and the dressing boards 500 being stored in the remaining storage regions 420 and 430.

According to the embodiment, in the storing step 1001, the operator registers processing conditions in the storage section 102 of the controller 100. The processing conditions include the kinds of the cutting blades 21 to be mounted on the spindles 23 of the cutting units 20 and the kinds of the dressing boards 500 to be held on the sub-chuck table 15.

According to the embodiment, in the storing step 1001, moreover, the operator stores the storage tray 400 where the cutting blades 21 and the dressing boards 500 are stored in the respective storage regions 420 and 430 into the storage chamber 40 in the orientation described above. The operator also stores workpieces 200 to be cut into the cassette 51 and places the cassette 51 on the upper surface of the storage chamber 40. In addition, the operator mounts cutting blades 21 of the kinds according to the processing conditions on the spindles 23 of the cutting units 20 and places a dressing board 500 of the kind according to the processing conditions on the upper surface 16 of the sub-chuck table 15.

According to the embodiment, in the storing step 1001, thereafter, the operation controlling section 101 of the controller 100 starts to perform a processing operation in response to a command to start the processing operation from the operator. Then, the sequence of the mounting method goes to replacement product position identifying step 1002.

Figure 16:
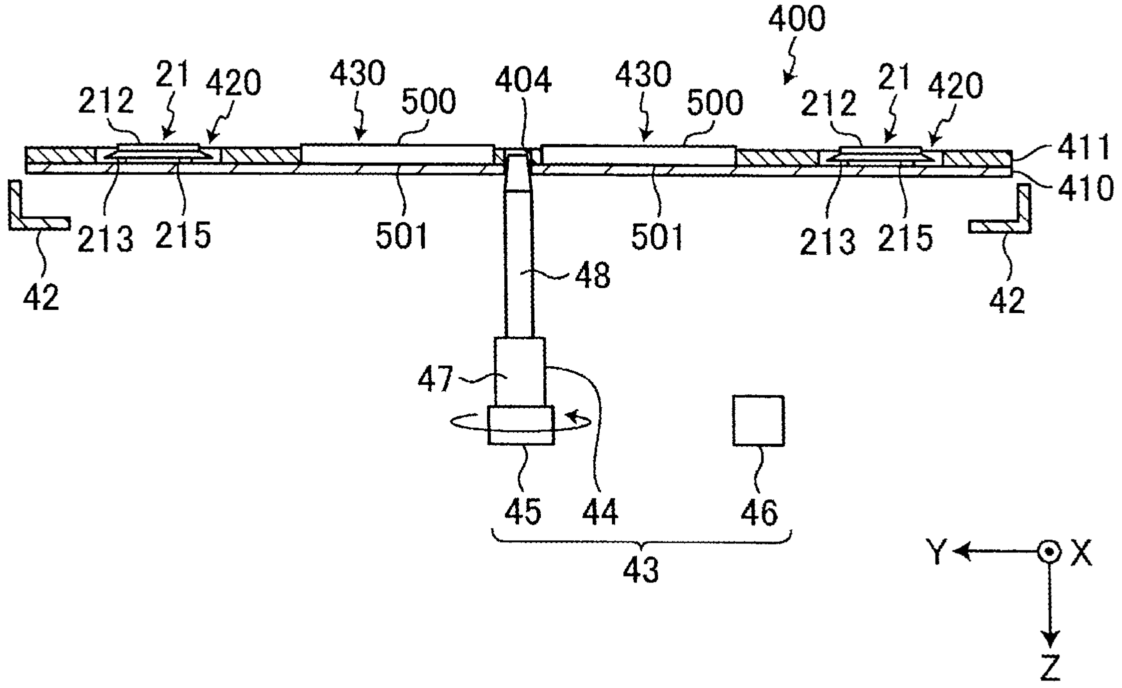
FIG. 16 is a cross-sectional view schematically illustrating, partly in side elevation, a replacement product position identifying step of the mounting method illustrated in FIG. 13.

FIG. 16 schematically illustrates, in cross section, partly in side elevation, replacement product position identifying step 1002 of the mounting method illustrated in FIG. 13. The replacement product position identifying step 1002 is a step of reading, with the reading unit 43, the identification marks 216 and 502 of the cutting blades 21 and the dressing boards 500 stored on the storage tray 400 and identifying which storage regions 420 and 430 of the storage tray 400 cutting blades 21 to be mounted on the spindles 23 of the cutting units 20 and a dressing board 500 to be held on the sub-chuck table 15 are stored in.

According to the present embodiment, in the replacement product position identifying step 1002, the operation controlling section 101 of the controller 100 extends the rod 48 of the lifting and lowering cylinder 44 in the storage chamber 40 to cause the upper end portion of the rod 48 to fit into the through hole 404 of the storage tray 400 and then lift the storage tray 400 in the storage chamber 40, as illustrated in FIG. 16. Moreover, while controlling the rotary actuator 45 to rotate the lifting and lowering cylinder 44, i.e., the storage tray 400, the operation controlling section 101 controls the image capturing camera 46 to capture images of the identification marks 216 and 502 of the cutting blades 21 and the dressing boards 500 stored in the storage regions 420 and 430.

According to the present embodiment, in the replacement product position identifying step 1002, then, the operation controlling section 101 identifies the kinds of the cutting blades 21 and the dressing boards 500 stored in the storage regions 420 and 430 from the images captured by the image capturing camera 46 and the angle through which the lifting and lowering cylinder 44 has been rotated, and stores the identified kinds of the cutting blades 21 and the dressing boards 500 stored in the storage regions 420 and 430 into the replacement product position storage section 103. The operation controlling section 101 also identifies non-storing storage regions 420-1, 430-1 from the images captured by the image capturing camera 46 and the angle through which the lifting and lowering cylinder 44 has been rotated, and stores the positions of the non-storing storage regions 420-1, 430-1 into the replacement product position storage section 103. The operation controlling section 101 positions the storage tray 400 in the storage chamber 40 into the orientation described above and contracts the rods 48 of the lifting and lowering cylinder 44 to place the storage tray 400 on support shelves 42 in the storage chamber 40. Then, the sequence of the mounting method goes to cutting step 1003.

Cutting step 1003 is a step of cutting a workpiece 200 with the cutting blades 21 of the cutting units 20. According to the present embodiment, in cutting step 1003, the operation controlling section 101 of the controller 100 actuates the vacuum suction source fluidly connected to the spindles 23 of the cutting units 20 to secure the cutting blades 21 to the mount flanges 24 on the spindles 23 and rotates the spindles 23, i.e. the cutting blades 21, at a rotational speed according to the processing conditions while supplying cutting water to the workpiece 200 and the cutting blades 21.

Furthermore, according to the present embodiment, in the cutting step 1003, the operation controlling section 101 places the table cover 60 in the standby position, places the replacing device 30 of the replacing mechanism 3 in the standby position, and holds a dressing board 500 under suction on the upper surface 16 of the sub-chuck table 15. Then, the operation controlling section 101 controls the delivery unit 80 to deliver a workpiece 200 form the cassette 51 to the holding table 10 that is in the loading and unloading position, controls the holding table 10 to hold the reverse side 204 of the workpiece 200 under suction on the holding surface 11 with the adhesive tape 210 interposed therebetween, and controls the clamps 12 to clamp the annular frame 211 in position.

Then, according to the present embodiment, in the cutting step 1003, the operation controlling section 101 controls the X-axis moving unit to move the holding table 10 to the processing position, controls the image capturing unit to capture an image of the workpiece 200, and performs the alignment process based on the image captured by the image capturing unit. After the alignment process, the operation controlling section 101 moves the workpiece 200 and the cutting units 20 relatively to each other along the projected dicing lines 202 and causes the cutting blades 21 to cut into the workpiece 200 along the projected dicing lines 202, dividing the workpiece 200 into individual device chips including the respective devices 203.

Then, according to the present embodiment, in the cutting step 1003, the operation controlling section 101 controls the cleaning unit 70 to clean the workpiece 200 that has been divided into the individual device chips and thereafter controls the delivery unit 80 to store the cleaned workpiece 200 into the cassette 51. After the cutting process on the workpiece 200 has been finished, the operation controlling section 101 determines whether all the workpieces 200 in the cassette 51 have been cut or not (step 1004).

If the operation controlling section 101 determines that not all the workpieces 200 in the cassette 51 have been cut (step 1004: No), then the operation controlling section 101 determines whether a replacement timing for replacing the cutting blades 21 mounted on the respective cutting units 20 and the dressing board 500 held on the sub-chuck table 15 has been reached or not (step 1005).

The replacement timing refers to a timing to replace the cutting blades 21 mounted on the respective cutting units 20 and the dressing board 500 held on the sub-chuck table 15. A replacement timing for the cutting blades 21 comes each time a cutting blade 21 has cut a preset number of workpieces 200 or each time a cutting blade 21 has been consumed or worn to a preset degree. The replacement timing for the cutting blades 21 is established per cutting blade 21 and registered as part of the processing conditions in the storage section 102 of the controller 100. A replacement timing for the dressing boards 500 comes each time a dressing board 500 has dressed a cutting blade 21 a preset number of times and is registered as part of the processing conditions in the storage section 102 of the controller 100. A replacement timing according to the present invention may occur while a single workpiece 200 is being processed or may come when a workpiece 200 is replaced while a plurality of workpieces 200 are being processed in succession.

If the operation controlling section 101 determines that a replacement timing has not been reached (step 1005: No), then the sequence of the mounting method goes back to cutting step 1003 in which the cutting units 20 cut a workpiece 200. If the operation controlling section 101 determines that a replacement timing has been reached (step 1005: Yes), the sequence of the mounting method goes to positioning step 1006. Hereinafter, a process of replacing the cutting blades 21 mounted on the spindles 23 of the respective cutting units 20 will be described below. According to the present invention, however, the cutting blade 21 mounted on the spindle 23 of either one of the cutting units 20 may be replaced.

Positioning step 1006 is a step of positioning the storage tray 400 where the cutting blades 21 and the dressing boards 500 are stored in a consumable product replacing position. According to the present embodiment, the consumable product replacing position is a position above the table cover 60 that is in the table protecting position. According to the present invention, however, the consumable product replacing position may be a position above the support walls 87 of the centering guides 82.

According to the present embodiment, in positioning step 1006, the operation controlling section 101 stops rotating the cutting blades 21 of the respective cutting units 20 and stops supplying the cutting water. Then, the operation controlling section 101 places the holding table 10 in the loading and unloading position and places the table cover 60 in the table protecting position. Then, the operation controlling section 101 controls the delivery unit 80 to deliver a storage tray 400 from the storage chamber 40 to the position above the holding table 10 and to place the storage tray 400 on the table cover 60 that is in the table protecting position.

According to the present embodiment, in the positioning step 1006, then, the operation controlling section 101 refers to the information stored in the replacement product position storage section 103, identifies a blade storage region 420 of the storage tray 400 that stores a cutting blade 21 (hereinafter referred to as "replacement cutting blade" denoted by 21-1 in FIG. 17, etc.) of the kind to be mounted on one of the cutting units 20 (hereinafter denoted by 20-1 in FIG. 17, etc.), and identifies a blade storage region 420 of the storage tray 400 that stores a cutting blade 21 (hereinafter referred to as "replacement cutting blade" denoted by 21-2 in FIG. 17, etc.) of the kind to be mounted on the other cutting units 20 (hereinafter denoted by 20-2 in FIG. 17, etc.). Then, the operation controlling section 101 controls the moving unit 31, etc. of the replacing mechanism 3 to hold the replacement cutting blade 21-1 stored in the identified blade storage region 420 of the storage tray 400 under suction on the holding surface 331 of the first holder 33 and to hold the replacement cutting blade 21-1 stored in the identified blade storage region 420 of the storage tray 400 under suction on the holding surface 341 of the second holder 34. Thereafter, the sequence of the mounting method goes to dismounting step 1007.

Figure 17:
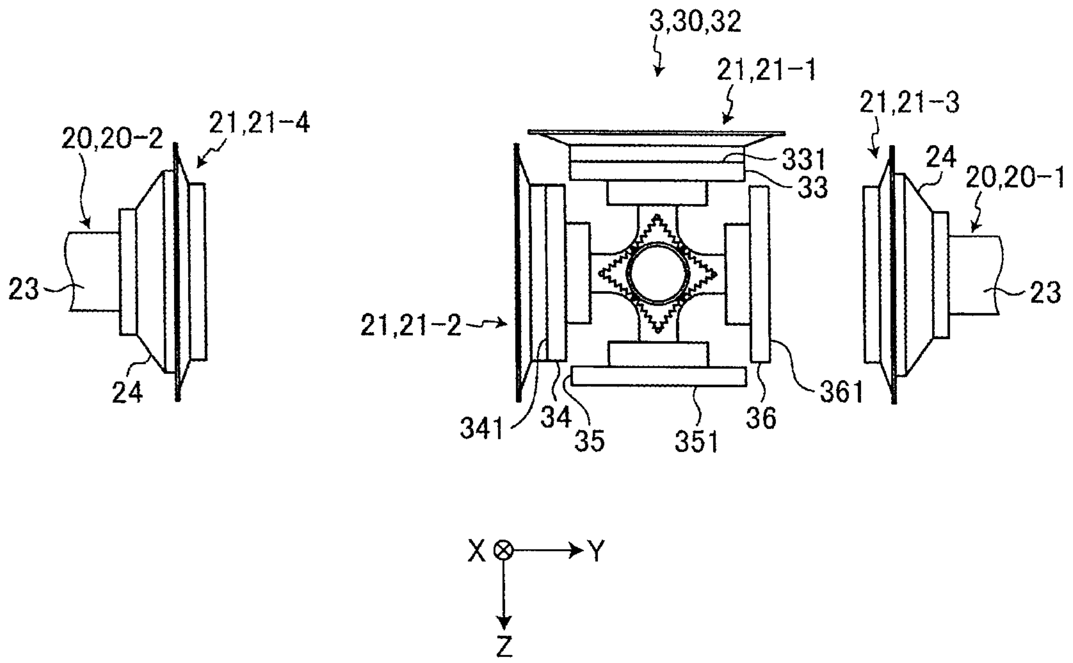
FIG. 17 is a view schematically illustrating the manner in which a replacing device that is holding replacement cutting blades on a first holder and a second holder of the replacing mechanism is positioned between cutting units in a dismounting step of the mounting method illustrated in FIG. 13.
Figure 18:
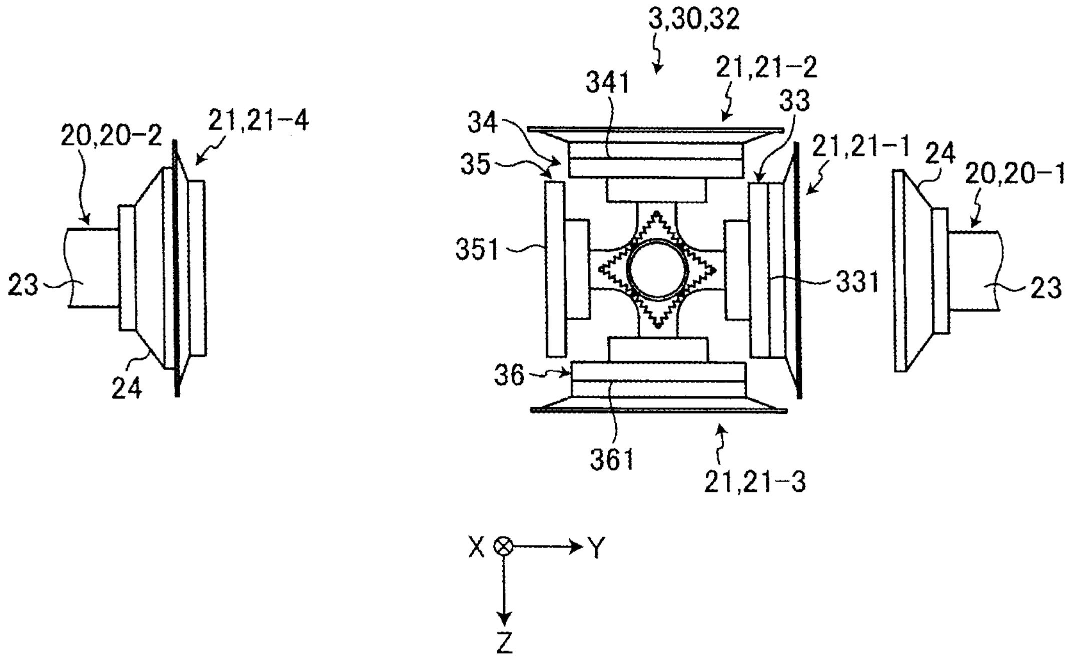
FIG. 18 is a view schematically illustrating the manner in which the replacing device of the replacing mechanism has dismounted a used cutting blade from one of the cutting units in the dismounting step of the mounting method illustrated in FIG. 13.
Figure 19:
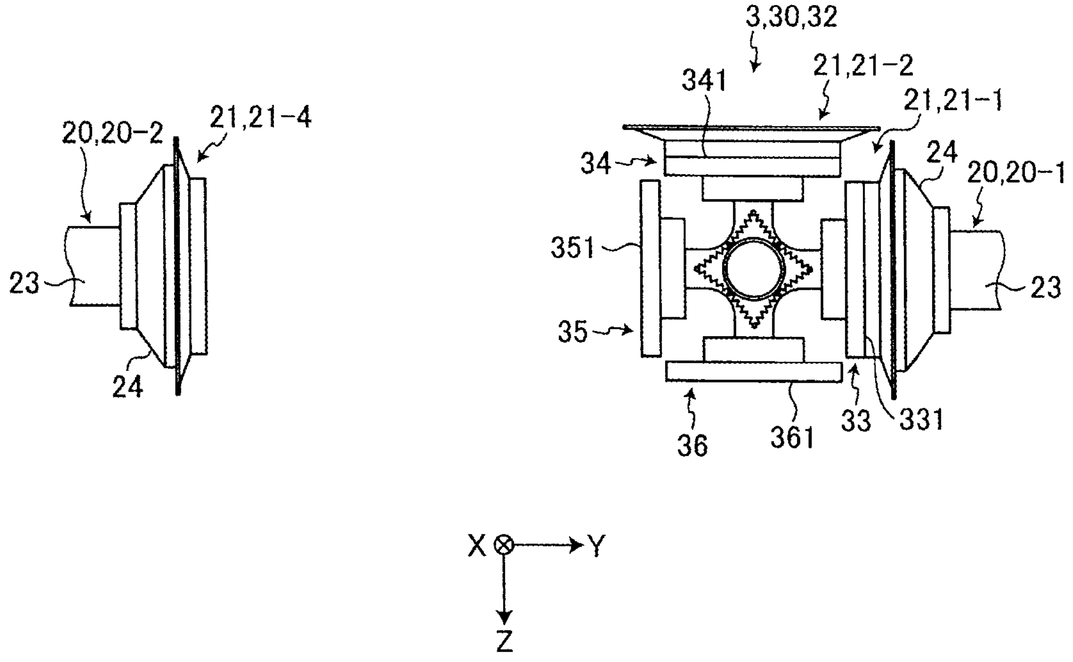
FIG. 19 is a view schematically illustrating the manner in which the replacing device of the replacing mechanism has mounted a replacement cutting blade on one of the cutting units in the dismounting step of the mounting method illustrated in FIG. 13.
Figure 20:
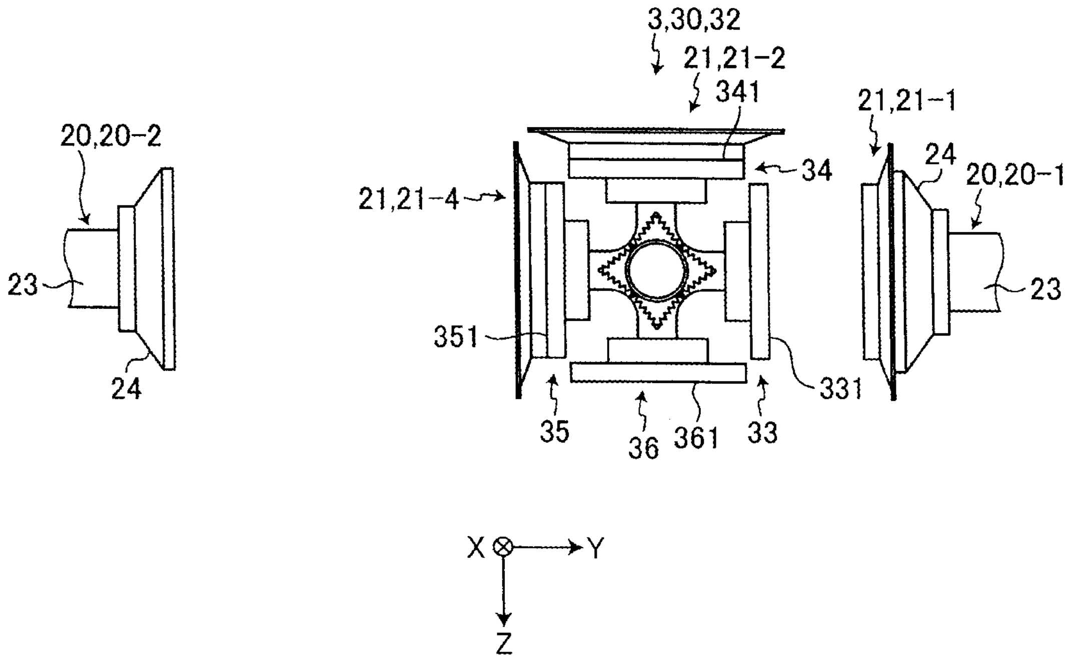
FIG. 20 is a view schematically illustrating the manner in which the replacing device of the replacing mechanism has dismounted a used cutting blade from the other cutting unit in a second dismounting step of the mounting method illustrated in FIG. 13.
Figure 21:
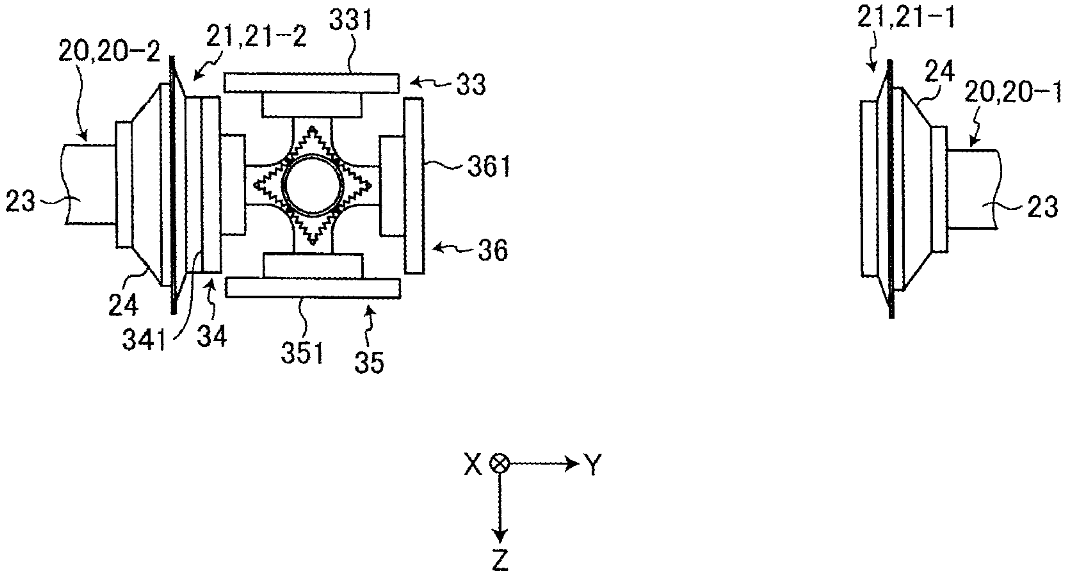
FIG. 21 is a view schematically illustrating the manner in which the replacing device of the replacing mechanism has mounted a replacement cutting blade on the other cutting unit in a mounting step of the mounting method illustrated in FIG. 13.
Figure 22:
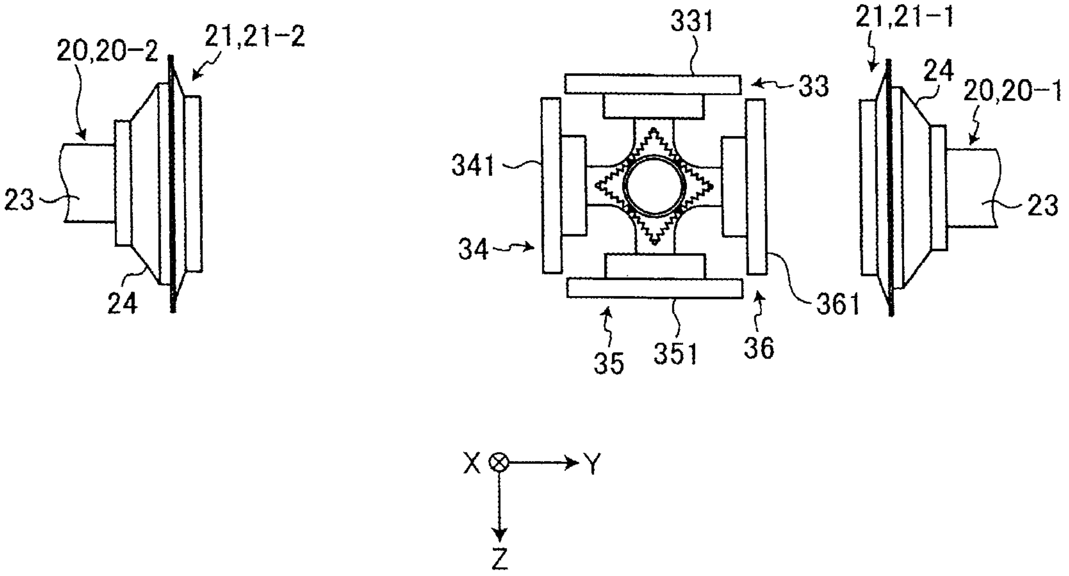
FIG. 22 is a view schematically illustrating the manner in which the replacing device of the replacing mechanism has completed the replacement of the cutting blades in the mounting step of the mounting method illustrated in FIG. 13.

FIG. 17 schematically illustrates the manner in which the replacing device 30 that is holding the replacement cutting units 20-1 and 20-2 on the first holder 33 and the second holder 34 of the replacing mechanism 3 is positioned between the cutting units 20 in dismounting step 1007 of the mounting method illustrated in FIG. 13. FIG. 18 schematically illustrates the manner in which the replacing device 30 of the replacing mechanism 3 has dismounted a used cutting blade 21 from the cutting unit 20-1 in dismounting step 1007 of the mounting method illustrated in FIG. 13. FIG. 19 schematically illustrates the manner in which the replacing device 30 of the replacing mechanism 3 has mounted the replacement cutting blade 21-1 on the cutting unit 20-1 in mounting step 1008 of the mounting method illustrated in FIG. 13. FIG. 20 schematically illustrates the manner in which the replacing device 30 of the replacing mechanism 3 has dismounted a used cutting blade 21 from the other cutting unit 20-2 in second dismounting step 1007 of the mounting method illustrated in FIG. 13. FIG. 21 schematically illustrates the manner in which the replacing device 30 of the replacing mechanism 3 has mounted the replacement cutting blade 21-2 on the cutting unit 20-2 in mounting step 1008 of the mounting method illustrated in FIG. 13. FIG. 22 schematically illustrates the manner in which the replacing device 30 of the replacing mechanism 3 has completed the replacement of the cutting blades 21 in mounting step 1008 of the mounting method illustrated in FIG. 13.

Dismounting step 1007 is a step of, after positioning step 1006 has been carried out and before mounting step 1008 is carried out, dismounting a used cutting blade 21 from the cutting apparatus 1 and storing the used cutting blade 21 in the non-storing storage region 420-1 of the storage tray 400, with the replacing device 30 of the replacing mechanism 3. Mounting step 1008 is a step of, after positioning step 1006 has been carried out, mounting the replacement cutting blades 21-1 and 21-2 on the cutting units 20-1 and 20-2, respectively, of the cutting apparatus 1 on the basis of the positions, i.e., the storage regions, identified in replacement product position identifying step 1002, with the replacing device 30 of the replacing mechanism 3.

According to the present embodiment, in dismounting step 1007, the operation controlling section 101 releases the cutting blades 21 from the respective cutting units 20-1 and 20-2 as by inactivating the vacuum suction source. Then, the operation controlling section 101 controls the moving unit 31 of the replacing mechanism 3 to place the replacing device 30 where the cutting blade 21-1 is held under suction on the first holder 33 and the cutting blade 21-2 is held under suction on the second holder 34, in the replacing position, as illustrated in FIG. 17.

According to the present embodiment, in the dismounting step 1007, then, the operation controlling section 101 controls the moving unit 31, etc. of the replacing mechanism 3 to hold a used cutting blade 21 (hereinafter denoted by 21-3) mounted on the cutting unit 20-1 under suction on the holding surface 361 of the fourth holder 36 of the replacing device 30, as illustrated in FIG. 18. Then, the operation controlling section 101 controls the moving unit 31, etc. of the replacing mechanism 3 to store the used cutting blade 21-3 held under suction on the holding surface 361 of the fourth holder 36 in the non-storing storage region 420-1 of the storage tray 400 and to stop holding the cutting blade 21-3 under suction on the holding surface 361 of the fourth holder 36. Thereafter, the sequence of the mounting method goes to mounting step 1008.

According to the present embodiment, in mounting step 1008, the operation controlling section 101 controls the moving unit 31, etc. of the replacing mechanism 3 to mount the replacement cutting blade 21-1 held under suction on the holding surface 331 of the first holder 33 of the replacing device 30 on the spindle 23 of the cutting unit 20-1. Then, the operation controlling section 101 actuates the vacuum suction source connected to the cutting unit 20-1 to secure the cutting blade 21-1 to the spindle 23 of the cutting unit 20-1 and stops holding the cutting blade 21-1 under suction on the holding surface 331 of the first holder 33.

Thereafter, the operation controlling section 101 determines whether the replacement of the cutting blades 21-1 and 21-2 has been finished or not (step 1009). According to the present embodiment, after first mounting step 1008, the replacement of the cutting blade 21-1 on the cutting unit 20-1 has been finished whereas the replacement of the cutting blade 21-2 on the other cutting unit 20-2 has not been finished.

If the operation controlling section 101 determines that the replacement of the cutting blades 21-1 and 21-2 has not been finished (step 1009: No), then the sequence of the mounting method goes back to step dismounting step 1007.

According to the present embodiment, in second dismounting step 1007, the operation controlling section 101 controls the moving unit 31 of the replacing mechanism 3 to hold a used cutting blade 21 (hereinafter denoted by 21-4) mounted on the cutting unit 20-2 under suction on the holding surface 351 of the third holder 35 of the replacing device 30, as illustrated in FIG. 20. Then, the operation controlling section 101 controls the moving unit 31, etc. of the replacing mechanism 3 to store the used cutting blade 21-4 held under suction on the holding surface 331 of the third holder 35 in the non-storing storage region 420-1 of the storage tray 400 and to stop holding the cutting blade 21-4 under suction on the holding surface 331 of the fourth holder 35. Thereafter, the sequence of the mounting method goes again to mounting step 1008.

According to the present embodiment, in second mounting step 1008, the operation controlling section 101 controls the moving unit 31, etc. of the replacing mechanism 3 to mount the replacement cutting blade 21-2 held under suction on the holding surface 341 of the second holder 34 of the replacing device 30 on the spindle 23 of the cutting unit 20-2. Then, the operation controlling section 101 actuates the vacuum suction source connected to the cutting unit 20-2 to secure the cutting blade 21-2 to the spindle 23 of the cutting unit 20-2 and stops holding the cutting blade 21-2 under suction on the holding surface 341 of the second holder 34.

In the mounting method according to the present embodiment, as described above, the operation controlling section 101 of the controller 100 refers to the information stored in the replacement product position storage section 103, identifies blade storage regions 420 of the storage tray 400 that store the replacement cutting blades 21-1 and 21-2 of the kinds to be mounted on the cutting units 20-1 and 20-2 of the storage tray 400, holds the replacement cutting blades 21-1 and 21-2 under suction on the holders 33 and 34 of the replacing device 30 of the replacing mechanism 3, and mounts the replacement cutting blades 21-1 and 21-2 on the respective cutting units 20-1 and 20-2 with the replacing device 30 in mounting step 1008. In mounting step 1008, therefore, the replacing device 30 mounts the replacement cutting blades 21-1 and 21-2 from the storage tray 400 in the cutting apparatus 1 on the basis of the positions identified in replacement product position identifying step 1002. In the mounting method according to the present embodiment, the replacing mechanism 3 thus mounts the cutting blades 21 disposed in the positions stored in the replacement product position storage section 103 in the cutting apparatus 1.

Thereafter, the operation controlling section 101 determines whether the replacement of the cutting blades 21-1 and 21-2 has been finished or not (step 1009). If the operation controlling section 101 determines that the replacement of the cutting blades 21-1 and 21-2 has been finished (step 1009: Yes), as illustrated in FIG. 22, then the sequence of the mounting method goes back to cutting step 1003. After the cutting process on the workpiece 200 has been finished, if the operation controlling section 101 determines that all the workpieces 200 in the cassette 51 have been cut (step 1004: Yes), then the operation controlling section 101 brings the processing operation, i.e., the mounting method, to an end.

According to the present embodiment, after dismounting step 1007 and mounting step 1008 have been performed on the cutting unit 20-1, dismounting step 1007 and mounting step 1008 are performed on the other cutting unit 20-2. According to the present invention, however, dismounting step 1007 and mounting step 1008 may be successively performed on both the cutting units 20-1 and 20-2. According to the present embodiment, it has been described that the cutting blades 21-1 and 21-2 on the cutting units 20-1 and 20-2 are replaced. According to the present invention, dismounting step 1007 and mounting step 1008 may be successively performed to replace the dressing board 500 held on the sub-chuck table 15 in the same manner as with the embodiment. According to the present invention, furthermore, a piece of silicon shaped as a rectangular plate may be replaced as a consumable product instead of the dressing board 500.

With the mounting method and the cutting apparatus 1 according to the present embodiment, the reading unit 43 reads the identification marks 216 and 502 of the cutting blades 21 and the dressing boards 500 that are randomly stored on the storage tray 400, and the kinds of the cutting blades 21 and the dressing boards 500 stored in the respective storage regions 420 and 430 are identified in replacement product position identifying step 1002. With the mounting method and the cutting apparatus 1 according to the present embodiment, consequently, it is not necessary to register the kinds of the cutting blades 21 and the dressing boards 500 stored in the respective storage regions 420 and 430 of the storage tray 400 before they are processed.

As a result, the mounting method and the cutting apparatus 1 according to the present embodiment can make tasks required prior to a processing operation, i.e., pre-processing tasks, less tedious and time-consuming.

Moreover, with the cutting apparatus 1 according to the present embodiment, since the reading unit 43 includes the rotary actuator 45 for rotating the storage tray 400 and the image capturing camera 46 rotatable by the rotary actuator 45, the image capturing camera 46 can be smaller than a line sensor that would otherwise be used to capture an image of the storage tray 400 while the storage tray 400 is being delivered from the storage chamber 40, the line sensor being equal in length to the storage tray 400. As a result, the cutting apparatus 1 according to the present embodiment can be smaller in size than if the line sensor is used to capture an image of the storage tray 400 while the storage tray 400 is being delivered from the storage chamber 40.

In addition, inasmuch as the reading unit 43 includes the rotary actuator 45 for rotating the storage tray 400 and the image capturing camera 46 rotatable by the rotary actuator 45, the reading unit 43 can be installed in the storage chamber 40, making the cutting apparatus 1 much smaller in size.

If the identification marks 216 and 502 are read while the storage tray 400 is being delivered from the storage chamber 40, then reading failures may possibly occur due to extraneous light or shadow that may be applied to the identification marks 216 and 502. With the cutting apparatus 1 according to the present embodiment, however, as the identification marks 216 and 502 are read in the storage chamber 40, the possibility of reading failures is lower.

[Modification]

Figure 23:
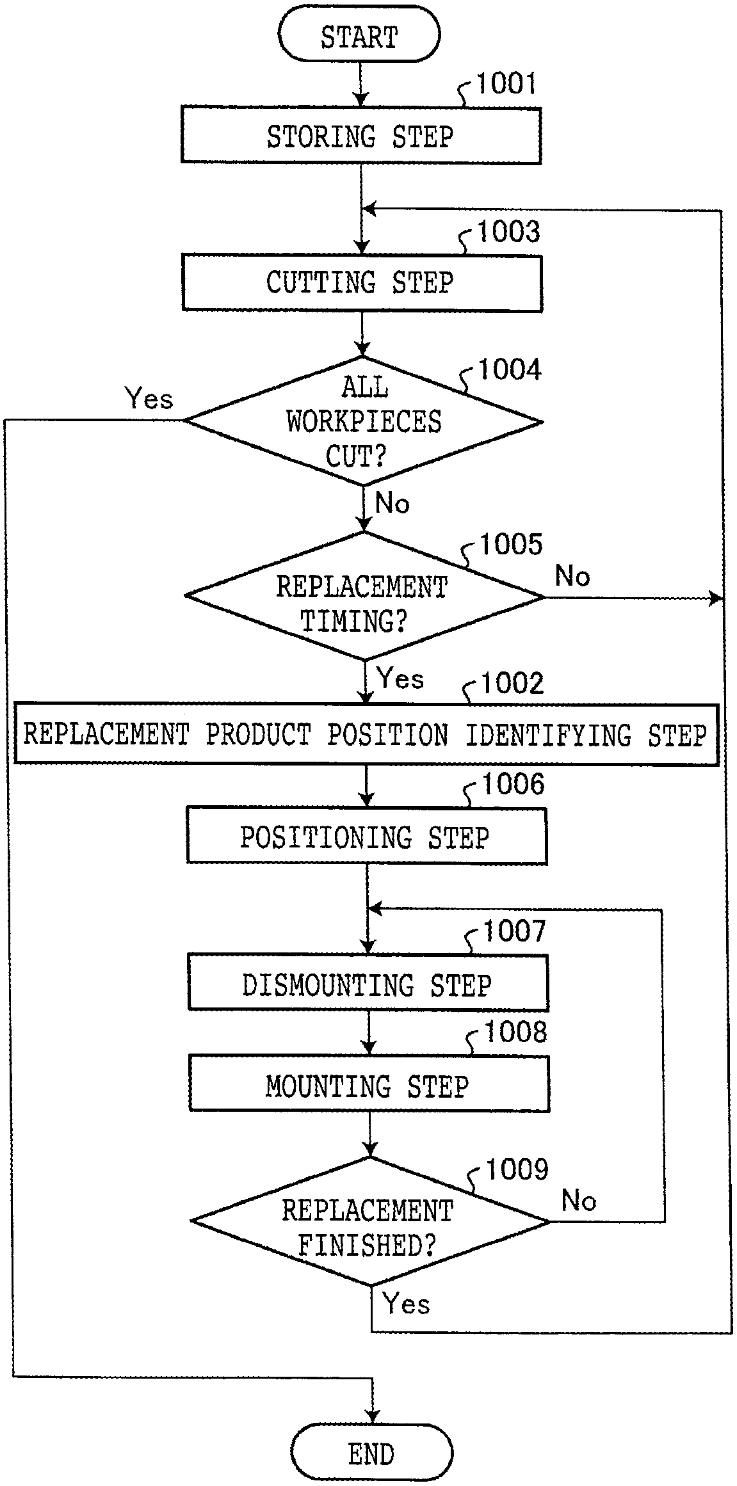
FIG. 23 is a flowchart of the sequence of a mounting method according to a modification of the embodiment.

A mounting method according to a modification of the embodiment will be described below with reference to the drawings. FIG. 23 is a flowchart of the sequence of the mounting method according to the modification of the embodiment. Those steps illustrated in FIG. 23 that are identical to the steps of the mounting method illustrated in FIG. 23 are denoted by identical reference characters and will be omitted from detailed description. The mounting method according to the modification is similar to the mounting method according to the embodiment except that, as illustrated in FIG. 23, replacement product position identifying step 1002 is not carried out immediately after storing step 1001, but carried out if the operation controlling section 101 determines that a replacement timing has been reached (step 1005: Yes), and after replacement product position identifying step 1002 has been carried out, positioning step 1006, dismounting step 1007, and mounting step 1008 are carried out.

In the mounting method according to the modification, the reading unit 43 reads the identification marks 216 and 502 of the cutting blades 21 and the dressing boards 500 that are randomly stored on the storage tray 400, and the kinds of the cutting blades 21 and the dressing boards 500 stored in the respective storage regions 420 and 430 are identified in replacement product position identifying step 1002. Therefore, as with the embodiment, it is not necessary to register the kinds of the cutting blades 21 and the dressing boards 500 stored in the respective storage regions 420 and 430 of the storage tray 400 before they are processed, so that the mounting method according to the modification is advantageous effect in that it can make pre-processing tasks less tedious and time-consuming.

The present invention is not limited to the above embodiment and modification. Various changes and modifications may be made therein without departing from the scope of the invention. For example, according to the present invention, at least one storage tray 400 may be stored in the cassette 51, and the reading unit 43 may be installed in the cassette 51. According to the present invention, furthermore, the operator or the like may directly store a plurality of storage trays 400 in the storage chamber 40 or may store a plurality of storage trays 400 in the cassette 51, and one of the delivery arms 81 may pull one of the storage trays 400 out of the cassette 51 and load the storage tray 400 into the storage chamber 40 through the opening in the side wall facing the spinner table 71, after which replacement product position identifying step 1002 may be carried out. In this case, it is desirable to register in advance which the cassette 51 the storage trays 400 are stored on.

According to the present invention, moreover, the identification marks 216 and 502 may be applied to the face sides 217 of the support bases 212 of the cutting blades 21 and the upper surfaces 503 of the dressing boards 500, and the cutting blades 21 and the dressing boards 500 may be stored on the storage trays 400 such that the identification marks 216 and 502 are exposed upwardly. If the cutting blades 21 and the dressing boards 500 are stored on the storage trays 400 such that the identification marks 216 and 502 are exposed upwardly, then the image capturing camera 46 may be disposed above the support shelves 42 in the storage chamber 40 for capturing images of the identification marks 216 and 502. According to the present invention, both replacement consumable products and used consumable products may not be stored on one storage tray 400, but a storage tray 400 dedicated to storing replacement consumable products and a storage tray 400 dedicated to storing used consumable products may be prepared, and used consumable products that have been replaced with replacement consumable products may be stored on the storage tray 400 dedicated to storing used consumable products.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A mounting method of mounting consumable products having respective identification marks in a cutting apparatus that includes a holding table for holding a workpiece thereon, a cutting unit having a spindle on which a cutting blade for cutting the workpiece held on the holding table is mounted, a replacing mechanism for replacing consumable products including the cutting blade, a controller for controlling at least the cutting unit and the replacing mechanism, a reading unit for reading identification marks on consumable products stored in respective storage regions of a storage tray, a storage chamber for storing therein the storage tray with the consumable products stored in the storage regions thereof, and wherein the reading unit is disposed in the storage chamber, and wherein the controller includes: a storage section for storing information of the consumable products to be mounted in the cutting apparatus, and a replacement product position storage section for identifying and storing which storage regions of the storage tray the consumable products to be mounted in the cutting apparatus have been stored in, on a basis of the identification marks read by the reading unit, and the mounting method comprising:

a storing step of storing a plurality of consumable products on the storage regions of the storage tray;

a replacement product position identifying step of reading the identification marks on the consumable products stored on the storage tray with the reading unit and identifying which storage regions the consumable products to be mounted in the cutting apparatus are stored in, on a basis of the read identification marks;

a positioning step of positioning the storage tray on which the consumable products are stored in a consumable product replacing position; and after the positioning step has been carried out, a mounting step of mounting one of the consumable products from the storage tray in the cutting apparatus with the replacing mechanism on a basis of the storage regions identified in the replacement product position identifying step.

2. The mounting method according to claim 1, wherein:

the storing step includes storing the consumable products on the storage tray such that no consumable product has been stored in at least one of the storage regions, the mounting method further including:

after the positioning step has been carried out and before the mounting step is carried out, a dismounting step of dismounting a used consumable product from the cutting apparatus with the replacing mechanism and storing the dismounted used consumable product in the storage region in which n the consumable product on the storage tray has not been stored.

3. A cutting apparatus comprising:

a holding table for holding a workpiece thereon;

a cutting unit having a spindle on which a cutting blade for cutting the workpiece held on the holding table is mounted;

a replacing mechanism for replacing consumable products including the cutting blade;

a controller for controlling at least the cutting unit and the replacing mechanism;

a reading unit for reading identification marks on consumable products stored in respective storage regions of a storage tray; and a storage chamber for storing therein the storage tray with the consumable products stored in the storage regions thereof, and wherein the reading unit is disposed in the storage chamber, and wherein the controller includes:

a storage section for storing information of the consumable products to be mounted in the cutting apparatus, and a replacement product position storage section for identifying and storing which storage regions of the storage tray the consumable products to be mounted in the cutting apparatus have been stored in, on a basis of the identification marks read by the reading unit, and the replacing mechanism mounts the consumable products from the storage regions identified and stored by the replacement product position storage section in the cutting apparatus.

4. A cutting apparatus comprising:

a holding table for holding a workpiece thereon;

a cutting unit having a spindle on which a cutting blade for cutting the workpiece held on the holding table is mounted;

a replacing mechanism for replacing consumable products including the cutting blade;

a controller for controlling at least the cutting unit and the replacing mechanism;

a reading unit for reading identification marks on consumable products stored in respective storage regions of a storage tray;

a cassette rest base on which a cassette storing the workpieces therein is placed, the cassette rest base being liftable and lowerable; and a storage chamber for storing therein the storage tray with the consumable products stored in the storage regions thereof, the storage chamber being lifted and lowered in unison with the cassette rest base, the cassette being placed on the storage chamber, wherein the reading unit is disposed in the storage chamber, and wherein the controller includes:

a storage section for storing information of the consumable products to be mounted in the cutting apparatus, and a replacement product position storage section for identifying and storing which storage regions of the storage tray the consumable products to be mounted in the cutting apparatus have been stored in, on a basis of the identification marks read by the reading unit, and the replacing mechanism mounts the consumable products from the storage regions identified and stored by the replacement product position storage section in the cutting apparatus.

5. The cutting apparatus according to claim 3, wherein:

the consumable products are stored on the storage tray with the identification marks held abutting against the storage tray, the storage tray includes regions aligned with the respective identification marks on the consumable products stored on the storage tray, the regions being each made of a transparent material, and the reading unit includes an image capturing camera for capturing images of the identification marks through the storage tray.

* * * * *